(12) United States Patent
Hurwitz

(10) Patent No.: US 10,439,580 B2
(45) Date of Patent: Oct. 8, 2019

(54) METHOD FOR FABRICATING RF RESONATORS AND FILTERS

(71) Applicant: Dror Hurwitz, Zhuhai (CN)

(72) Inventor: Dror Hurwitz, Zhuhai (CN)

(73) Assignee: Zhuhai Crystal Resonance Technologies Co., Ltd., Zhuhai (CN)

( * ) Notice: Subject to any disclaimer, the term of this patent is extended or adjusted under 35 U.S.C. 154(b) by 296 days.

(21) Appl. No.: 15/468,766

(22) Filed: Mar. 24, 2017

(65) Prior Publication Data
US 2018/0278227 A1   Sep. 27, 2018

(51) Int. Cl.
*H03H 3/02* (2006.01)
*H03H 9/10* (2006.01)
*H03H 9/58* (2006.01)

(52) U.S. Cl.
CPC ............ *H03H 3/02* (2013.01); *H03H 9/1014* (2013.01); *H03H 9/581* (2013.01); *H03H 9/582* (2013.01)

(58) Field of Classification Search
CPC ........ H03H 3/02; H03H 9/1014; H03H 9/581; H03H 9/582
See application file for complete search history.

(56) References Cited

U.S. PATENT DOCUMENTS

| 6,060,818 | A * | 5/2000 | Ruby | ................. H03H 3/02 29/25.35 |
| 6,842,088 | B2 * | 1/2005 | Yamada | .............. B06B 1/0644 310/322 |

(Continued)

FOREIGN PATENT DOCUMENTS

WO   WO 2007119643 A1 * 10/2007

*Primary Examiner* — Carl J Arbes
(74) *Attorney, Agent, or Firm* — Wiggin and Dana LLP; Gregory S. Rosenblatt

(57) ABSTRACT

A method of fabricating an RF filter comprising an array of resonators, the method comprising the steps of:
(a) Obtaining a removable carrier with release layer;
(b) Growing a piezoelectric film on a removable carrier;
(c) Applying a first electrode to the piezoelectric film;
(d) Obtaining a backing membrane on a cover, with or without prefabricated cavities between the backing film and cover;
(e) Attaching the backing membrane to the first electrode;
(f) Detaching the removable carrier;
(g) Measuring and trimming the piezoelectric film as necessary;
(h) Selectively etching away the piezoelectric layer to fabricate discrete resonator islands;
(i) Etching down through coatings backing membrane, silicon dioxide and into silicon handle to form trenches;
(j) Applying passivation layer into the trenches and around the piezoelectric islands;
(k) Depositing a second electrode layer over the dielectric and piezoelectric film islands;
(l) Applying connections for subsequent electrical coupling to an interposer;
(m) Selectively remove second electrode material leaving coupled resonator arrays;
(n) Create gasket around perimeter of the resonator array;
(o) Thinning down cover of handle to desired thickness;
(p) Optionally fabricating cavities between the silicon membrane and handle;
(q) Dicing the wafer into flip chip single unit filter arrays;
(r) Obtaining an interposer;
(s) Optionally applying a dam to the interposer surface to halt overfill flow;
(t) Coupling the flip chip single unit filter array to pads of the interposer by reflow of the solder cap;
(u) Encapsulating with polymer overfill; and
(v) Singulating into separate filter modules.

31 Claims, 20 Drawing Sheets

(56) References Cited

U.S. PATENT DOCUMENTS

| | | | | |
|---|---|---|---|---|
| 8,387,943 B1* | 3/2013 | Mattheis | ................... | F16K 7/06 |
| | | | | 251/4 |
| 2002/0014808 A1* | 2/2002 | Misu | ................. | H03H 9/02133 |
| | | | | 310/312 |
| 2003/0141946 A1* | 7/2003 | Ruby | ...................... | H03H 3/02 |
| | | | | 333/187 |
| 2004/0263287 A1* | 12/2004 | Ginsburg | ........... | H03H 9/02133 |
| | | | | 333/187 |

* cited by examiner

METHOD FOR FABRICATING RF RESONATORS AND FILTERS

BACKGROUND

Mobile phone users require quality reception and transmission over a wide area. The quality of the radio frequency (RF) signal depends on the RF filters in the mobile phone. Each RF filter passes desired frequencies and rejects unwanted frequencies enabling band selection and allowing a mobile phone to process only the intended signal.

It has been estimated that by 2020, a shift to Carrier aggregation, 5G and 4×4 MIMO could result in mobile phones requiring upwards of 100 filters and a global market of 200 billion filters a year.

Acoustic resonators are basic building blocks of RF filters and sensors. These typically include a piezoelectric electromechanical transduction layer which converts mechanical energy into electrical energy. These resonators have to be cheap but reliable. The two most common types of acoustic resonators are Surface Acoustic Wave Resonators (SAW) and Bulk Acoustic Wave Resonators (BAW).

In Surface Acoustic Wave resonators the acoustic signal is carried by a surface wave. In Bulk Acoustic Wave Resonators (BAW) the signal is carried through the bulk of the resonator film. The resonant frequency of both types of filter is a characteristic of its dimensions and of the mechanical properties of the materials used in its construction.

The quality of a resonator is given by its Q factor. This is the ratio of the energy stored to the power dissipated. A high Q factor indicates that the filter loses little energy during operation. This translates to a lower insertion loss and a steeper skirt for "sharper" differentiation to nearby bands.

The next generation of mobile phones will be required to operate at higher frequencies to enable transmitting and receiving the ever growing data traffic. Moving to such higher frequencies without enlarging the mobile phone requires small low power resonators that operate at higher frequencies and that can be used in smart phones without rapid depletion of the battery power pack.

The quality factor or Q factor is a dimensionless parameter that describes how under-damped an oscillator or resonator is, and characterizes a resonator's bandwidth relative to its center frequency. The next generation of mobile phones requires quality resonators having high Q factors.

Bulk-acoustic-wave (BAW) filters provide better performance than surface acoustic wave filters. Whereas the best SAW filters may have Q factors of 1000 to 1500, current state of the art BAW resonators have Q factors of 2500 to 5000.

BAW filters can operate at higher frequencies than SAW filters. They have better power handling, smaller sizes, higher electrostatic discharges (ESD), better bulk radiation and less out of band ripple.

However, SAW filters are simpler and cheaper to manufacture and since the IDT pitch can be varied by the mask layout, resonators having significantly different frequencies can be made on the same die, using the same piezoelectric film thickness.

The electrical impedance of a BAW resonator has two characteristic frequencies: the resonance frequency $f_R$ and anti-resonance frequency $f_A$. At $f_R$, the electrical impedance is very small whereas at $f_A$, the electrical impedance is very large. Filters are made by combining several resonators. The shunt resonator is shifted in frequency with respect to the series resonator. When the resonance frequency of the series resonator equals the anti-resonance frequency of the shunt resonator, the maximum signal is transmitted from the input to the output of the device. At the anti-resonance frequency of the series resonator, the impedance between the input and output terminals is high and the filter transmission is blocked. At the resonance frequency of the shunt resonator, any current flowing into the filter section is shorted to ground by the low impedance of the shunt resonator so that the BAW filter also blocks signal transmission at this frequency. The frequency spacing between $f_R$ and $f_A$ determines the filter bandwidth.

For frequencies other than the resonance and anti-resonance frequencies, the BAW resonator behaves like a Metal-Insulator-Metal (MIM) capacitor. Consequently, far below and far above these resonances, the magnitude of the electrical impedance is proportional to 1/f where f is the frequency. The frequency separation between $f_R$ and $f_A$ is a measure of the strength of the piezoelectric effect in the resonator that is known as the effective coupling coefficient—represented by $K^2_{eff}$. Another way to describe the effective coupling coefficient is as a measure of the efficiency of the conversion between electrical and mechanical energy by the resonator (or filter). It will be noted that the electromechanical coupling coefficient is a materials related property that defines the $K^2_{eff}$ for the piezoelectric film.

The level of performance of a filter is given by its factor of merit (FOM) which is defined as FOM=Q*$K^2_{eff}$.

For practical applications, both a sufficiently high $K^2_{eff}$ and high Q factor values are desired. However, there is a trade-off between these parameters. Although $K^2_{eff}$ is not a function of frequency, the Q-value is frequency dependent and therefore the FOM (Factor of Merit) is also a function of frequency. Hence the FOM is more commonly used in filter design than in the resonator design.

Depending on the application, often device designers can tolerate a lowering in the $K^2_{eff}$ to achieve a high Q factor where a small sacrifice in $K^2_{eff}$ gives a large boost in the Q value. However, the opposite approach of sacrificing Q-value to obtain a design having an adequate $K^2_{eff}$ is not feasible.

$K^2_{eff}$ can be enhanced by choosing a high acoustic impedance electrode, and can also be traded off with other parameters such as electrode thickness and a thicker passivation layer.

There are two main types of BAW resonators (and thus filters): SMR (Solidly Mounted Resonators) and FBAR (Film Bulk Acoustic Resonator resonators.

In the SMR resonator, a Bragg reflector is created under the bottom electrode using a stack of alternating low and high impedance thin film layers, each having a thickness λ/4, where λ is the wavelength of the target frequency. The Bragg reflector stack acts an acoustic mirror to reflect the acoustic wave back into the resonator.

SMR resonators are easier (and thus typically cheaper) to manufacture than FBAR resonators and since the piezoelectric film is attached directly to the substrate, heat is dissipated more effectively. However, in SMR based filters, only the longitudinal acoustic wave is reflected but not the shear waves. Consequently SMR filters have lower Q factors than FBAR based filters.

In the FBAR resonator a free-standing bulk acoustic membrane which is supported only around its edge is used. An air cavity is provided between the bottom electrode and the carrier wafer. The high Q factor of the FBAR is a great advantage over the SMR.

The Commercial FBAR filter market is dominated by Broadcom™ (previously AVAGO™) which uses Aluminum Nitride (AlN) as the piezoelectric thin-film material that best balances performance, manufacturability and Wafer Level Packaging (WLP) processing that employs Si cavity microcapping over the FBAR device with TSV (through silicon via) for flip chip electrical contacts. AlN has the highest acoustic velocity for a piezoelectric film (11,300 m/s) and hence requires a thicker film for a given resonance frequency which eases process tolerances. Furthermore, high quality sputtered AlN films with FWHM (Full width at half maximum XRD peak) of less than 1.8 degrees allow $K^2_{eff}$ values that are above 6.4% which is conveniently about twice the transmit band for FCC mandated PCS. With Q values reaching 5000, FOM values of 250 to 300 are achievable, representing best in class filter devices. $K^2_{eff}$ must be kept constant to meet the band requirement. Consequently, to improve the FOM of a filter generally requires increasing the Q value.

Despite the high performance of the above mentioned FBAR filters, issues still remain that prevent moving forward to the next generation of wireless communication. The greater number of users sending and receiving more data results in increasingly jammed bands. To overcome this, future bandwidths should be more flexible to adapt to agile arrangements of different bands. For example, The 5 GHz WiFi band has 3 sub-bands located at 5.150-5.350 GHz, 5.475-5.725 GHz, 5.725-5.825 GHz, respectively, corresponding to required $K^2_{eff}$ of around 7.6%, 8.8% and 3.4%. The coupling coefficient $K^2_{eff}$ is mainly decided by the intrinsic nature of the piezoelectric material, but is affected by the crystalline quality and orientation of the piezo film, by exterior capacitors and inductors and by the thickness of the electrodes and other stacked materials. The bandwidth of AlN FBARs is mainly modulated by inductors and capacitors that are pre-integrated into the IC substrate carriers. However, these elements degrade the Q factor and also increase the substrate layer count and thus increase the size of the final product. Another approach for $K^2_{eff}$ modulation is to use an electrostrictive material to realize tunable band FBAR filters. One candidate material is $Ba_xSr_{1-x}TiO_3$ (BST) that may be tuned once the DC electrical field is applied.

Tunability with BST can also be achieved by using the material as a variable capacitor build in part with the FBAR resonators circuitry thereby assisting in matching filters and in adjusting their rejection. Furthermore, since a BST FBAR resonates only with a certain applied DC bias voltage, it may represent low leakage switching properties, potentially eliminating switches from the Front End Module (FEM) of the mobile device and thereby simplifying module architecture and reducing both size and cost. BST FBARs also possess other favorable properties for RF applications. The high permittivity of ferroelectric materials ($\varepsilon r$>100) allows for reduction in the size of devices; for example, a typical BST resonator area and BST filter area is in the order of 0.001 $mm^2$ and 0.01 $mm^2$, respectively, at low GHz frequencies in standard 50-$\Omega$ RF systems. In fact, using BST the resonator size may be an order of magnitude smaller than that of conventional AlN resonators. Moreover, the power consumption in the BST FBAR itself is negligible—even with the usage of the above-mentioned DC bias voltage across the device due to a very small leakage current in the BST thin-film.

Strong c-axis texture is the most important prerequisite for AlN or BST based FBARs because the acoustic mode for such FBARs needs to be longitudinally activated, and the piezoelectric axis of both AlN and BST is along the c-axis. Hence high quality single crystal piezo film, as represented by FWHM of less than 1°, have great impact on the FBAR filter properties and can reduce the RF power that is otherwise wasted as heat by as much as 50%. This power saving can significantly reduce the rate of drop calls and increase the battery life of mobile phones.

Epitaxial piezoelectric films with single orientation may have other merits. For example, strongly textured epitaxially grown single crystal piezo films are expected to have smoother surfaces than those of randomly oriented films. This in turn, results in reduced scattering loss and a smoother interface between the metal electrodes to the piezo films which both contribute to a higher Q-factor.

Furthermore, there is an inverse thickness to operating frequency relationship for AlN and BST filter films. Ultra thin-films are needed for extremely high frequency filters such as 5 GHz WiFi, Ku and K band filters. For filter operating at 6.5 GHz the thickness of BST film should be around 270 nm and for 10 GHz the thickness of an AlN film should be around 200 nm. These dimensions invokes serious challenges for film growth because it is hard to attain the necessary stiffness for an extremely thin anchored membrane and the crystalline defects and strains are more likely to cause cracks and mechanical failures as the membrane film becomes thinner. As such, more innovative membrane supporting structures with defect-free single crystal films are needed for the next generation of high frequency FBARs.

Unfortunately, AlN, BST and other piezoelectric materials have vast lattice spacing and orientation differences to those of currently used bottom electrode metals. Furthermore, the range of bottom electrode materials available, especially in the case of BST, is very limited since they have to withstand relatively high temperatures during the subsequent deposition of the piezo film thereupon. As a result, to date, no true high quality single crystal piezo FBAR films have been successfully demonstrated.

SUMMARY

An aspect of the technology is directed to a method of fabricating an RF filter comprising an array of resonators comprising the steps of:
  (a) Obtaining a removable carrier with release layer;
  (b) Growing a piezoelectric film on a removable carrier;
  (c) Applying a first electrode to the piezoelectric film;
  (d) Obtaining a backing membrane on handle, with or without prefabricated cavities between the backing membrane and handle;
  (e) Attaching the backing membrane to the first electrode;
  (f) Detaching the removable carrier;
  (g) Measuring and trimming the piezoelectric film as necessary;
  (h) Selectively etching away the piezoelectric layer to fabricate discrete piezo islands;
  (i) Etching down through the coatings, backing membrane, silicon dioxide and into the silicon handle to form trenches;
  (j) Applying a passivation layer into the trenches and on and around the piezoelectric islands;
  (k) Depositing a second electrode layer over the dielectric and piezoelectric film islands;
  (l) Applying connections for subsequent electrical coupling to an interposer;
  (m) Selectively remove second electrode material leaving coupled resonator arrays;
  (n) Creating a gasket around the perimeter of the resonator may;
  (o) Thinning down the cover (handle) to a desired thickness;

(p) Optionally fabricating cavities between membrane and handle;
(q) Dicing the wafer into flip chip single unit filter arrays;
(r) Obtaining an interposer;
(s) Optionally applying a dam to the interposer surface to halt the overfill flow;
(t) Coupling the resonator array to pads of the interposer by reflow of the solder cap;
(u) Encapsulating with polymer overfill; and
(v) Singulating into separate filter modules.

Typically, the removable carrier with release layer of step (a) comprises a single crystal sapphire substrate with a GaN release layer.

Typically, the piezoelectric film comprises $B_{ax}S_{r(1-x)}TiO_3$ (BST).

Typically, the piezoelectric layer comprises a single crystal layer having a <111> orientation.

Typically, the piezoelectric layer comprises the removable carrier is characterized by at least one of the following limitations:
the removable carrier comprises sapphire;
the removable carrier comprises a release coating of GaN;
the removable carrier is a C-axis <0001> with a tolerance of ±1';
the removable carrier is a commercially available sapphire C-axis <0001> single crystal wafer with a un-doped GaN coating having C-axis <0001> with an orientation tolerance of ±1°.

Optionally, step (b) comprises at least one preliminary step selected from step (bi) of depositing a heat dissipating onto reverse side of the carrier to aid heat dissipation during the deposition of the piezoelectric layer, and step (bii) of depositing a buffer layer of rutile c-axis <100> $TiO_2$ and/or a <111> $SrTiO_3$ layer over the removable carrier prior to depositing the piezoelectric.

Optionally, the rutile c-axis <100> $TiO_2$ and/or the <111> $SrTiO_3$ layer is deposited by molecular beam epitaxy.

Optionally, step (b) of fabricating the piezoelectric film comprises deposition by molecular beam epitaxy.

Optionally, step (c) comprises depositing a first electrode of aluminum onto the piezoelectric film.

Typically, at least one of the following limitations is true:
(i) the aluminum electrode is in the range of 100 nm±5 nm to 150 nm±5 nm thick;
(ii) the aluminum electrode is deposited by PVD;
(iii) step (c) further comprises a preliminary step (ci) of depositing an adhesion layer onto the piezoelectric film to aid adhesion of the aluminum characterized by at least one of:
the adhesion layer comprises titanium;
the adhesion layer is 5-50 nm±5% thick, and
the adhesion layer is deposited by PVD.

Typically, the backing membrane on handle of step (d) comprises a silicon membrane attached to a silicon cover by a silicon oxide layer optionally further comprising pre-formed cavities between the silicon membrane and the silicon cover.

Typically step (e) of attaching the backing membrane on handle comprises depositing an adhesion layer and a bonding layer to the first electrode, and attaching an adhesion layer and bonding layer to the silicon membrane.

Typically, at least one of the following limitations true:
the adhesion layer comprises titanium;
the adhesion layer comprises titanium deposited by sputtering and removable with dilute hydrofluoric acid and/or with $CF_4/O_2$ Plasma;
the bonding layers are identical and may each comprise Au—In, Au or AlN.

Typically, step (f) of detaching the wafer carrier comprises laser lift off.

Typically, the wafer carrier comprises a sapphire single crystal wafer coated with GaN and the laser lift off comprises irradiating the GaN through the sapphire using a 248 nm excimer square waveform laser.

Typically, step (f) further comprises at least one of:
(i) removing GaN and any barrier layer by Induction Coupled Plasma (ICP), and
(ii) wherein if a heat dissipating layer was applied to the reverse of the sapphire carrier to aid deposition of an epitaxial single crystal piezoelectric, first removing said heat dissipating layer by at least one of chemical etching, mechanical polishing and chemical mechanical polishing (CMP).

Typically, step (g) of trimming the piezoelectric membrane to a desired thickness comprises applying a scanning surface ion milling process over the surface of the piezoelectric membrane.

Typically, step (h) of selectively etching away the piezoelectric layer to fabricate discrete resonator islands comprises applying an Induction Coupled Plasma (ICP).

Typically, step (i) of selectively removing coatings, adhesion layer, electrode, silicon and silicon oxide down to the handle comprises at least one of inductive plasma etching and Reactive Ion Etching (RIE).

Typically, step (j) of applying the passivation layer comprises: filling trenches and encapsulating piezoelectric islands with Photo-sensitive Polyimide or Benzocyclobutene (BCB) by spin-coating followed by exposing and developing the Polyimide or Benzocyclobutene (BCB) to selectively remove from top surfaces of the piezoelectric islands.

Typically, step (k) of applying a second electrode layer comprises depositing an adhesion layer of titanium followed by depositing aluminum electrode by PVD or sputtering.

Typically, step (l) comprises at least some of the following steps:
Applying an Under Bump Metallization UBM coating;
Applying a layer of copper over the UBM coating;
Fabricating copper pillars over the layer of copper;
Applying solder caps to the copper pillars;
Etching away excess copper and UBM away from copper pillars.

Typically, at least one of the following limitations is true:
applying an Under Bump Metallization UBM coating comprises applying one of a titanium coating, a tungsten coating, a Ti/W coating and a Ti/Ta coating, wherein said UBM coating has a thickness of between 500 nm and 1500 nm thick;
applying a layer of copper over UBM coating by sputtering;
fabricating copper pillars over the layer of copper and covering with solder by laying down a layer of photoresist, developing to form a negative pattern of pillars, electroplating copper into the pattern to required height, electroplating solder caps onto the copper pillars, and removing the photoresist leaving upstanding copper pillars with solder caps;
Removing the excess copper and the UBM away from copper pillars comprises one of:
exposing to an induction coupled plasma;
exposing to Ferric chloride solution;
exposing to Ammonium Persulfate Etchant.

Typically, step (m) of selectively removing the upper electrode material comprises applying an inductively coupled plasma comprising $Cl_2+BCl_3+Ar$ to remove the aluminum and selectively reactive induction etching away titanium with $CF_4$ or $SF_6$ and $O_2$.

Preferably in step (n) the UBM layer is also selectively retained around perimeter of the upper electrode remaining after step (m).

Typically, step (n) of creating a gasket comprises at least one of fabricating a SU8 polymer wall around perimeter of the resonator array, and fabricating an epoxy dam on the interposer to define a lower surface of bottom cavity.

Typically, step (o) of thinning down the cover is selected from the group comprising mechanical grinding, chemical mechanical polishing, wet etching together with atmospheric downstream plasma (ADP) and dry chemical etching (DCE).

Typically, the backing membrane and cover comprise silicon wafer membranes that are coupled together by silicon oxide layer and step (p) comprises applying a through silicon via etch to create through silicon vias in the silicon cover through to the silicon dioxide layer, and undercut etching away the $SiO_2$ with HF vapor to create cavities behind the silicon membrane that are bordered by the passivation layer and aligned with the piezoelectric resonator films.

Alternatively, the backing membrane and handle comprises a silicon film coupled to a silicon cover by silicon dioxide, with pre-formed cavities between the silicon film and the silicon cover, and the pre-formed cavities are carefully aligned with the piezoelectric islands.

Typically, step (r) of fabricating an interposer with routing layers comprises the steps of:
(i) depositing an etch-resistant barrier layer of onto a sacrificial copper substrate; (ii) sputtering a copper seed layer; (iii) applying a first layer of photo resist to a carrier; (iv) patterning an array of pads; (v) electroplating copper into the patterned array; (vi) stripping away the photo resist; (vii) applying a second thicker layer of photo resist; patterning an array of vias; (viii) stripping away the second thicker layer of photo resist; (ix) laminating with polymer film or glass fiber in polymer prepreg; (x) curing the polymer film or glass fiber in polymer prepreg; (xi) polishing to expose ends of copper vias; (xii) optionally repeating steps (ii) to (vi) or steps (ii) to (xi) to add additional single or double layers if required, and (xiii) etching away sacrificial substrate.

Typically, the dam is fabricated on the upper surface of the interposer by screen printing an epoxy; by depositing, exposing and developing a photo-sensitive thick solder mask or by applying, exposing, developing and curing an SU-8 layer.

BRIEF DESCRIPTION OF FIGURES

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several thin's of the invention may be embodied in practice. In particular, it will be appreciated that the schematic illustrations are not to scale, and the thickness of some very thin layers is exaggerated. In the accompanying drawings.

DESCRIPTION OF EMBODIMENTS

Figure 1:
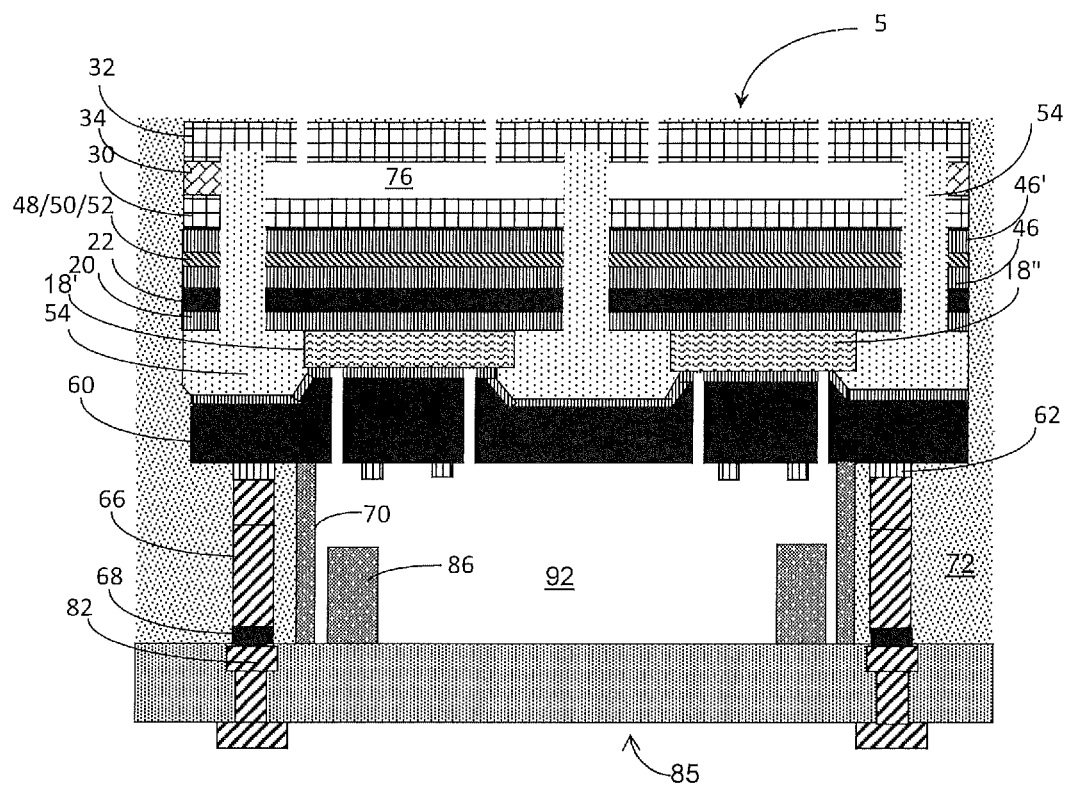
FIG. 1 is a schematic not-to-scale cross section representation of a Composite FBAR filter module which combines a plurality of Composite FBAR resonators coupled in half ladder or lattice arrangements or combinations thereof.
Figure 3:
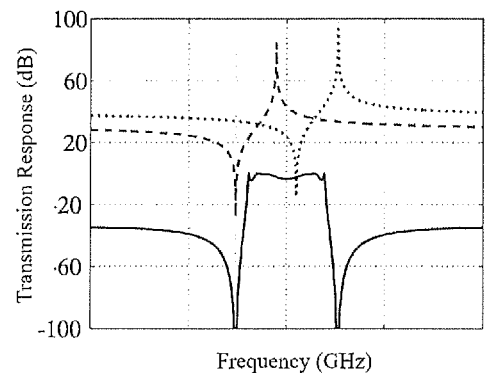
FIG. 3 is a graph showing the transmission response of the ladder filter configuration of FIG. 2.

By way of example, a design for a Composite FBAR filter module with single crystal $Ba_xSr_{(1-x)}TiO_3$ resonators is detailed hereunder with reference to FIG. 1, together with methods of manufacture with reference to FIG. 3.

With reference to FIG. 1 a Composite FBAR filter module 5 is schematically shown. The filter module 5 comprises a plurality of composite FBAR resonators coupled in half ladder or lattice arrangements or in combinations thereof. The composite FBAR resonators consist of piezoelectric films 18', 18" that are preferably single crystal $Ba_xSr_{(1-x)}TiO_3$ separated by a passivation material 54 such as a polyimide or BCB (Benzocyclobutene) and sandwiched between electrodes 22, 60.

In the method of construction described hereinbelow, it will be noted that both top and bottom electrodes 22, 60 are deposited onto the piezoelectric material 18 rather than by depositing a piezoelectric material on top of an electrode which is currently standard practice for FBAR filter construction. This enables a wider range of metals such as aluminum to be used as the electrodes. Aluminum has higher conductivity and is less dense, this enables decreasing the electrode weight and the subsequent mechanical damping it causes to the resonator. The electrode resonator material is coupled to a silicon film 30 which provides mechanical strength and low acoustic loss. The silicon film 30 is attached by a layer of silicon oxide 34 to a cover 32 that is a thicker silicon wafer and is known as a 'handle', providing a 'wafer on handle' using SOI technology. Cavities 76 are provided within the silicon oxide layer 34 opposite the piezoelectric resonator films 18. The bonding between the electrode 22 and the silicon film 30 may be achieved in a number of ways, such as by a gold-indium eutectic 48, Ni/Sn, a gold layer 50 or an AlN layer 52. Thin layers of one of these bonding materials may be attached to both the electrode 22 and to the silicon film 30 by adhesion layers 46, 46' such as titanium and then the thin layers of the bonding material are fused together.

The coated piezoelectric resonator array is attached to an interposer 85 by interconnects comprising solder 68 capped copper pillars 66, and is encapsulated in a polymer underfill/over-mold 72. A gasket 70 is provided around the filter, between the interposer 85 and the lower electrode 60 around the resonator array that defines the filter. The gasket 70 may consist of SU-8 attached to the lower electrode 60 and an epoxy dam 86 may be built up from the interposer 85. The gasket 70 and epoxy dam 86 work together to prevent the underfill/over-mold 72 that seals the unit from penetrating under the resonator array and define a cavity 92 between the lower electrode 60 and the interposer 85. Additional cavities 76 are provided over the piezoelectric films 18', 18" in the space between the silicon membrane 30 and cover 32, by selective removal of the silicon dioxide 34 by etching, with a grid of passivation material 54 that is typically polyimide or BCB (Benzocyclobutene) acting as an etch stop and defining the side walls of the cavity 76. The passivation material 54 also separates the upper electrode 22, adhesion layers 20, 46, 46' and bonding layers 48/50/52 into separate regions supporting pairs of parallel resonators and separating resonators that are connected in series.

An Under Bump Metallization (UBM) Layer 62 that comprises tungsten or tantalum (possibly with an adhesion layer of titanium), enables fabrication of the copper pillars 66 on the underside of the bottom electrode 60. Other remnants of the UBM 63 serve as stiffening weights around the perimeter of the lower electrode 60, which, being aluminum, has a very low weight. Thus the electrodes 22, 60 may be aluminum which has high conductivity and low mass, and thus hardly damps the resonator membranes 18', 18", but both mass and thickness giving stiffening may be provided around the edge of the electrodes where needed.

The Commercial FBAR filter market is dominated by Broadcom™ which uses Aluminum Nitride (AlN) as the piezoelectric thin-film material that best balances performance and manufacturability. However, preferred embodiments of the technology disclosed herein below use $Ba_xSr_{(1-x)}TiO_3$ (BST) since it enables filters that are an order of magnitude smaller since the dielectric constant thereof is one to two orders of magnitude higher than that of MN.

Because single crystal $Ba_xSr_{(1-x)}TiO_3$ may be used for the resonator membranes 18, very high quality filters may be fabricated. At the time of writing, best in class prior art FABRs have Factors of Merit (FOM) of 250-300. Since single crystal $Ba_xSr_{(1-x)}TiO_3$ can have a Q factor of 4000 one can achieve a FOM of 248 from this material with only 6.2% coupling. With a coupling of 8.5% one can achieve a FOM of 340.

It is stressed that to the best of our knowledge, single crystal membranes have never been used in resonators and single crystal membranes of $Ba_xSr_{(1-x)}TiO_3$ have never before been fabricated.

Figure 2:
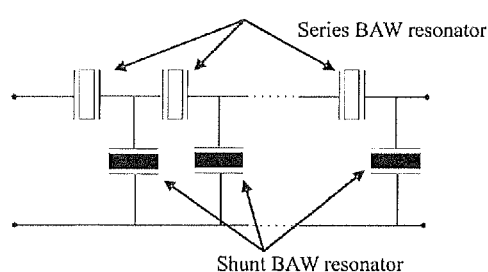
FIG. 2 is a simplified circuit of a ladder type RF filter configuration.
Figure 4:
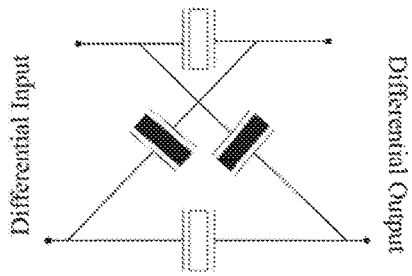
FIG. 4 is a simplified circuit of a lattice type RF filter configuration.
Figure 5:
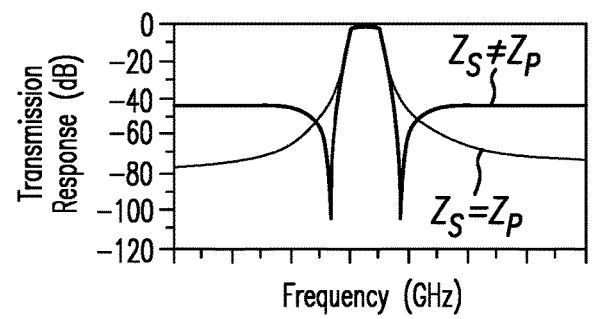
FIG. 5 is a graph showing the transmission response of the lattice type filter configuration of FIG. 4.

With reference to FIG. 2, a simplified circuit of a half ladder type filter configuration created by BAW resonators in series with shunt BAW resonators is shown. In a filter, resonators are combined in a 'ladder', wherein each 'rung' or 'stage' comprises two resonators: one in series and the other connected in shunt. With reference to FIG. 3, adding rungs to the ladder, improves the rejection of undesired frequencies, creating a signal with less out-of-band rejection (a steeper skirt) but this is at the expense of insertion loss and greater power consumption. With reference to FIG. 4, another resonator configuration may be a "lattice", which, as shown in FIG. 5 has poorer cutoff but better out-of-band attenuation.

Figure 6:
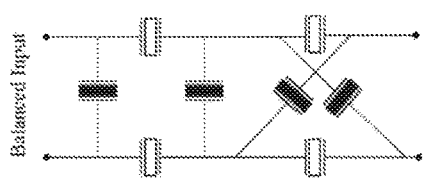
FIG. 6 is a simplified circuit of a combined ladder and lattice type RF filter configuration.
Figure 7:
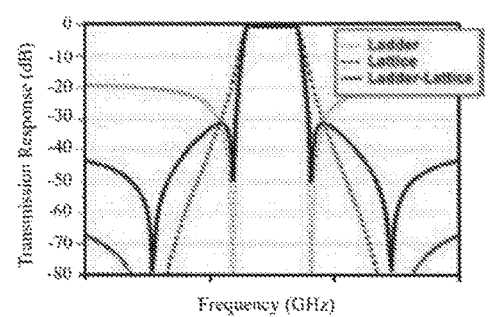
FIG. 7 is a graph showing the transmission response of the filter configuration of FIG. 7.
Figure 41:
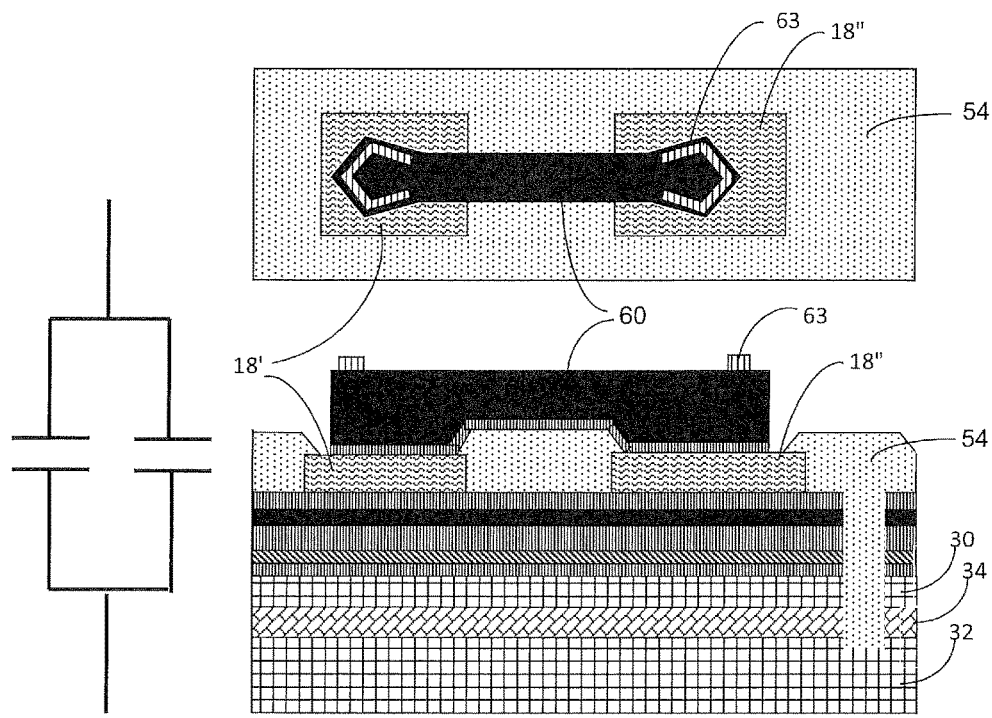
Figure 42:
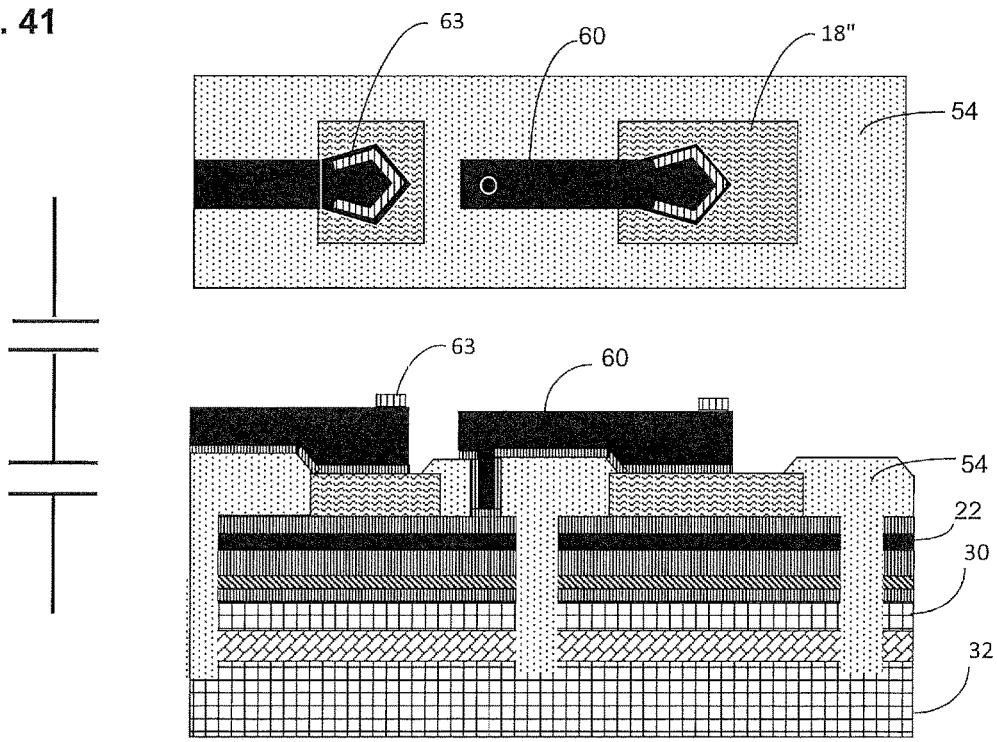

With reference to FIG. 6, the ladder and lattice type circuits may be combined to provide the transmission response shown in FIG. 7. The possible arrangements of resonators to create filters is beyond the scope of this application, but methods for fabricating resonators that are coupled in series and parallel are discussed hereunder with reference to FIGS. 41 and 42 and this enables arranging the resonators in the various ladder, lattice and combination arrangements.

Referring back to FIG. 1, in preferred embodiments, the resonator film 18 is a single crystal piezoelectric, preferably a <111> orientation single crystal of $Ba_xSr_{(1-x)}TiO_3$. Since there are no grain boundaries in a single crystal and further the acoustic mode for such FBARs is longitudinally activated along the <111> plane, the attenuation of the acoustic signal is minimal. This also minimizes the lost energy that is otherwise transferred into heat and which has to be dissipated.

Single crystal and strongly textured BST films have smoother surfaces than randomly oriented films. This results in reduced scattering loss and higher Q-factors. Furthermore, rough surfaces, especially at high frequencies, are a major cause of the loss of the metal electrodes interfaces because of a skin effect. The smooth electrode—piezolelectric interfaces obtainable in highly textured and single crystal films with both upper and lower electrodes deposited thereupon are thus extremely advantageous.

To the best of our knowledge, single crystal $Ba_xSr_{(1-x)}TiO_3$ resonator films and Composite FBAR filters have not been achieved in the past, and the technology described herein is directed to such films and to methods for their manufacture.

Composite FBAR structures consist of a thin piezoelectric film 18 sandwiched between top and bottom electrodes 22, 60. In the past, the electrode 22 was first deposited and then the piezoelectric layer 18 was fabricated thereupon. This required the electrode 22 to be made from a heavy metal such as platinum, molybdenum, tungsten or gold, that allows the high deposition temperatures required for subsequent piezoelectric film deposition thereupon. However, it has been found that such refractory metal have a crystal mismatch with BST and do not enable achieving single crystal $Ba_xSr_{(1-x)}TiO_3$ in a <111> orientation thereupon. Furthermore, most of these metals have poor DC resistance, potentially deteriorating the Q factor of the resonator. In preferred embodiments described herein the electrodes 22, 60 are deposited onto the piezoelectric film 18 using physical vapor techniques. This enables lightweight metals such as aluminum to be used, either on its own or in conjunction with other metal layers to form composite electrodes. Aluminum has a high conductivity and so a thinner electrode is possible. Aluminum is much less dense than refractory metals and so the weight of the electrodes and their damping effect is less. The quality and coupling of the resonators and filters thus formed are vastly superior to those of the prior art.

The mechanism used in ferroelectric BST Composite FBAR transducers is electrostriction which is the electric field induced piezoelectric effect. The top and bottom electrodes 22, 60 are used to apply direct current (DC) and radio frequency (RF) signals. The preferred BST Composite FBAR Composite structure described herein consists of a thin film single crystal BST film 18 sandwiched between top and bottom aluminum electrodes 22, 60. The BST film 18 converts mechanical to electrical energy and vice versa.

To provide stiffening without substantial weight, a low acoustic-loss silicon layer 30 is coupled to the piezoelectric films 18. The silicon layer 30 may have a thickness in the range of 1 μm to 10 μm, with the lowest possible thickness being preferable for best performance high frequency resonators. It should be noted that in Composite FBARs there are odd and even resonance modes, where each mode exhibits peak Q and Coupling as a function of the BST to silicon thickness ratio. The peak $K^2_{eff}$ values decrease with mode number because the fraction of acoustic displacement across the BST is reduced. However, the peak Q factor values increase with mode number, since the fraction of acoustic displacement across the low loss silicon layer increases. Hence, careful selection of the resonance mode is required for optimal FOM and low thickness silicon membranes with low thickness BST films are desired for higher frequencies filters. Cavities 76, 92 are provided above and below the piezoelectric 18 on silicon 30 combination. The structure is encapsulated with a polymer 72 and mounted on an interposer 85 and coupled thereto with copper pillars 66 that are typically about 40-50 μm wide and about 40 μm high and joined to upper contact pads 82 of the interposer 85 with solder 68. A polymer gasket 70 which may be fabricated from SU-8 to have a high four factor and/or a dam 86 (typically epoxy) may be provided around the perimeter of the filter structure to keep the polymer under-fill/overmold 72 from entering the lower cavity 92. The interposer 85 may be constructed using well established fabrication technologies.

The Composite FBAR shown in FIG. 1 has such a piezoelectric 18 on silicon 30 Composite FBAR structure, preferably wherein the piezoelectric film 18 is a BST single crystal <111> and the electrodes 22, 60 are fabricated from lightweight aluminum.

Although RF resonators are primarily used as filters, they find other uses, including as sensors, for example. There is also interest in tunable resonators that can operate at different frequencies.

Figure 8A:
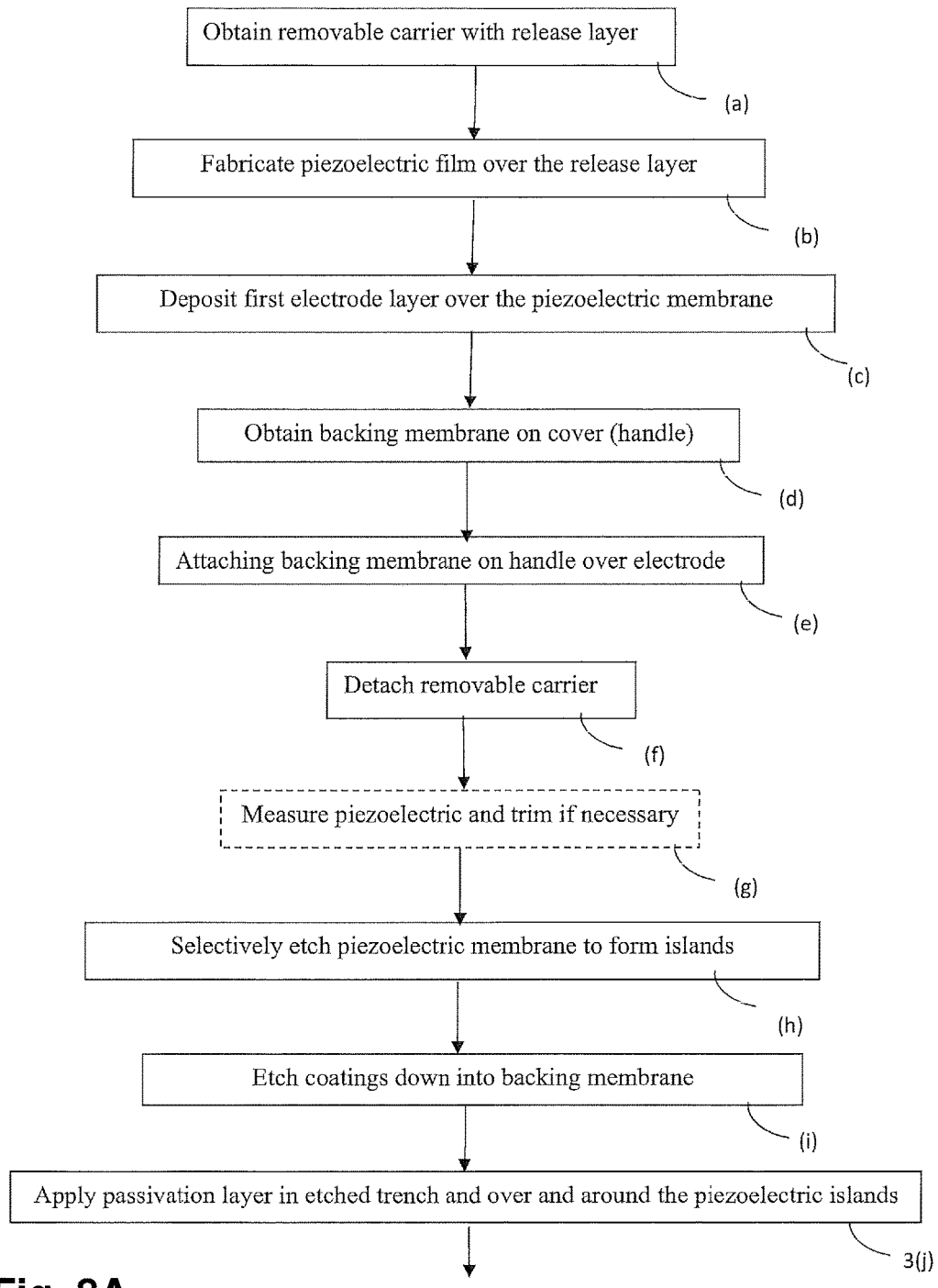
FIGS. 8A and 8B are flowcharts illustrating a method of fabricating the Composite FBAR structure of FIG. 1.
Figure 8B:
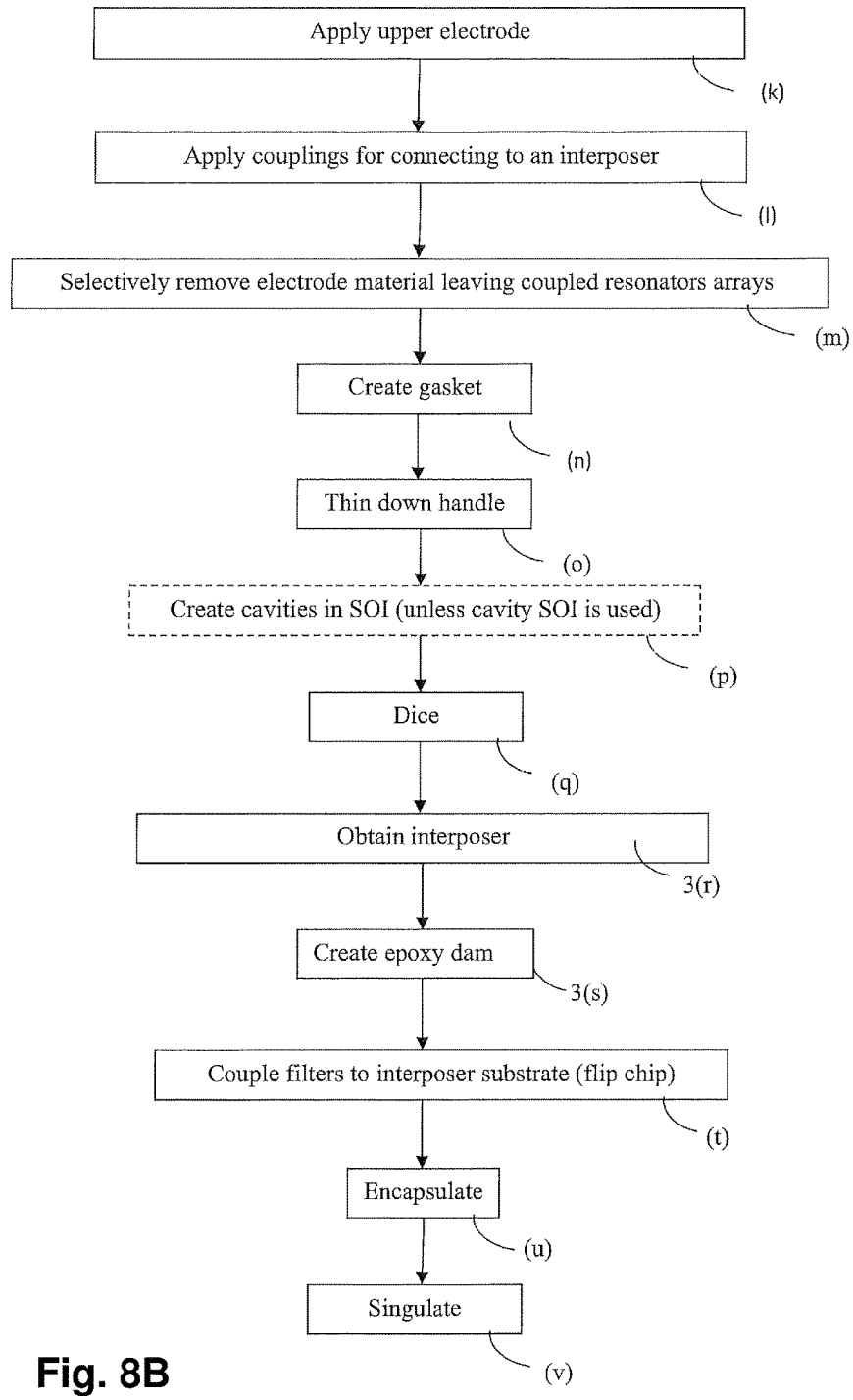
Figure 9:
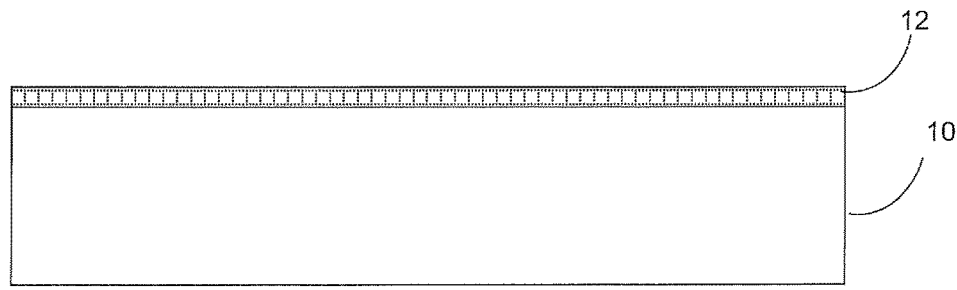
FIGS. 9 to 52 are schematic representations of the build up achieved by the corresponding steps in the flowchart of FIG. 3.

As shown in FIGS. 8A and 8B and with further reference to FIGS. 9 to 52, the main process flow for fabricating this consists of obtaining and providing a removable wafer carrier with a release layer—step (a), a schematic, not to scale representation is shown in FIG. 9. With reference to FIG. 9, a C-axis <0001>±1° Sapphire wafer 10 with an un-doped Gallium Nitride (U-GaN) release layer C-axis <0001>±1° 12 is obtained. Such sapphire wafers 10 with U-GaN 12 deposited thereon are commercially available. Such sapphire wafer layers 10 are available with diameters of 2", 4" and 6" in thicknesses of from 430 μm, and have a polished surface with an RMS smoothness of less than 1 nm. The U-GaN layer 12 has a typical thickness of 4 μm and a polished surface having an RMS of less than 1 nm ready for epitaxial growth thereon. These coated substrates were developed for the Light Emitting Diode (LED) industry and are commercially available from various Chinese manufacturers including San'an Optoelectronics Co., Ltd. (San'an) and Suzhou Nanowin Science and Technology Co., Ltd, (NANOWIN)™.

Figure 10:
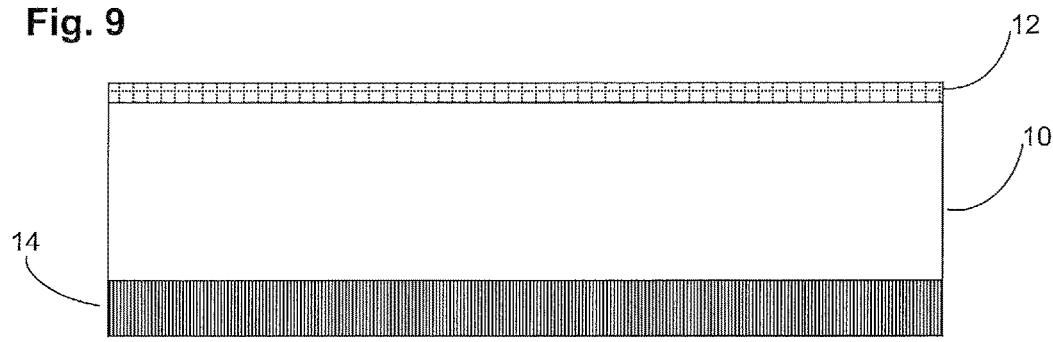

A piezoelectric film is now deposited onto the removable carrier 10—step (b). With reference to FIG. 10, to aid heat dissipation and thus thickness distribution during subsequent deposition of a piezoelectric film, a metal layer 14 is deposited on the back of the sapphire wafer 10—step (bi), i.e. the side opposite to the side coated with GaN 12. The thickness of the metal layer 14 depends on the metal used. In this instance, and because of the nature of the buffer layer 16 and piezoelectric material 18 subsequently deposited (see below) titanium is a good candidate for the heat dissipating metal layer 14, and an appropriate thickness for the heat dissipating layer 14 is about 150 nm. The heat dissipating metal layer 14 may be deposited by sputtering, for example.

Figure 11:
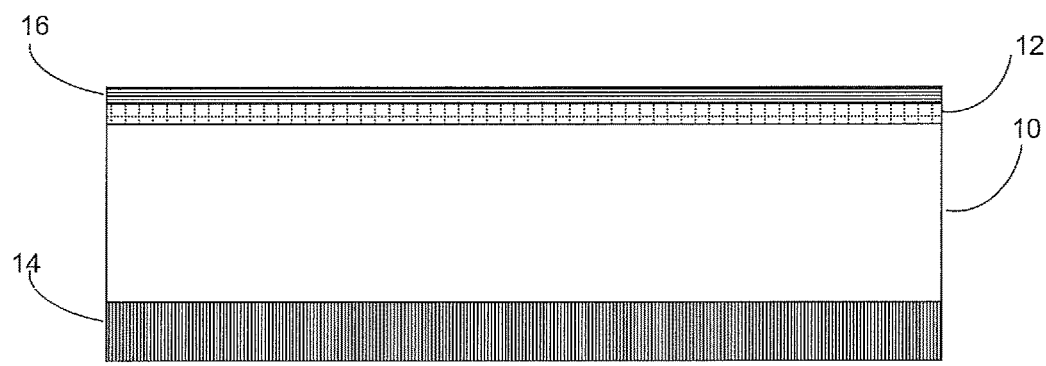

With reference to FIG. 11, a buffer layer 16 of <100> $TiO_2$ (rutile) or $SrTiO_3$ is then deposited onto the Gallium Nitride release layer C-axis <0001>±1°.

Figure 12:
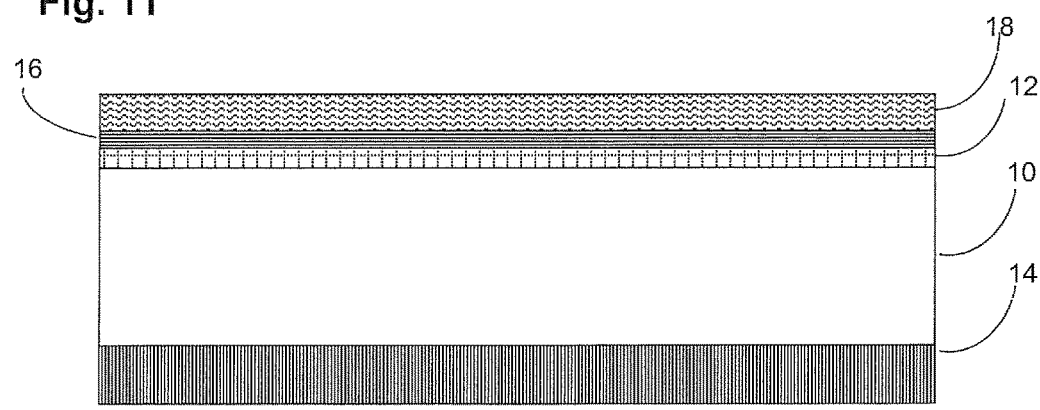

(U-GaN) 12 using Oxide Molecular Beam Epitaxy—step 3(bii). This may be achieved using commercially available equipment that is obtainable from vendors such as Varian™, Veeco™ and SVT Associates™, for example. The Gallium Nitride release layer 12 is typically about 4 nm thick with an RMS roughness of less than 2 nm. Because of the lattice matching between the <100> plane of the ruffle $TiO_2$ 16 and the <0001> plane of the GaN 12 and Sapphire 10, the $TiO_2$ 16 is laid down as a single crystal film. Instead of $TiO_2$ buffer layer 16, or between the $TiO_2$ and the $Ba_xSr_{(1-x)}TiO_3$ (BST) 18 film, a <111> buffer layer of $SrTiO_3$ may be deposited. Referring now to FIG. 12 a layer of $Ba_xSr_{(1-x)}TiO_3$ (BST) 18 having a thickness of between 10 nm and 50 nm and typically 20-40 nm is then deposited onto the rutile $TiO_2$, the $SrTiO_3$ or $TiO_2/SrTiO_3$ double layer buffer layer 16 by oxide molecular beam epitaxy (MBE) using targets of Barium Oxide, Strontium Oxide and Titanium Oxide in low pressure excess oxygen—step (b)iii. The oxide molecular beam epitaxy (MBE) is a high purity low energy deposition technique that allows for low point defect manufacturing. Because of the close matching between the <111> $Ba_xSr_{(1-x)}TiO_3$ 18 lattice spacing and the <100> $TiO_2$ (rutile) 16 and/or <111> $SrTiO_3$ lattice spacing, and between the <100> $TiO_2$ (rutile) 16 and <111> $SrTiO_3$ lattice spacing where both coatings are used, the $Ba_xSr_{(1-x)}TiO_3$ 18 is deposited as a single crystal film, and may have a thickness in the range of 100 nm to 500 nm within tolerances of ±1%.

Figure 53:
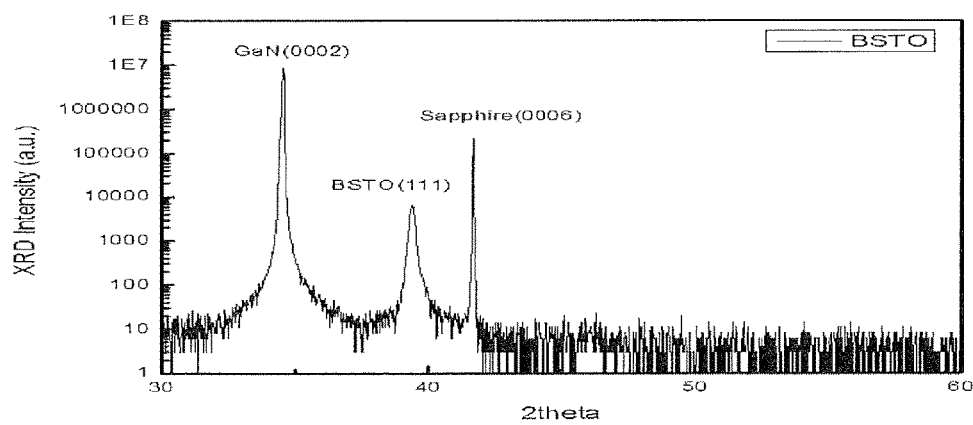
FIG. 53 is an XRD spectrum of a piezoelectric film of a $Ba_xSr_{(1-x)}TiO_3$ (BST) film on a carrier substrate showing that single crystal $Ba_xSr_{(1-x)}TiO_3$ (BST) was obtained.

With reference to FIG. 53 an XRD spectrum of the stack is shown. This demonstrates that the $Ba_xSr_{(1-x)}TiO_3$ film is truly epitaxial <111> single crystal $Ba_xSr_{(1-x)}TiO_3$. The full width half maximum (FWHM) of the XRD peak thus obtained may be less than 1°. Since grain boundaries inhibit the transmission of acoustic waves and in poly-crystal piezoelectric films it is not easy to control the grain size, unlike poly-crystal piezoelectric which attenuates the signal, it will be appreciated that using a single crystal film provides Q values above 3000 and BST coupling values above 6.6% and thus enables resonators having factors of merit (FOM) of 198, which is much better than anything previously achieved, despite the fact that the BST film is supported. Furthermore, very thin BST films are obtainable and this enables fabricating filters for very high frequency use.

It is possible to control the Barium to Strontium ratio with high accuracy of ±1% and this affects the Q factor and coupling of the film.

The epitaxially grown BST films may have a RMS roughness of less than 1.5 nm. This minimizes the so called ripple effect.

Using BST, preferably single crystal BST as the piezoelectric material in Composite FBARs provides several favorable properties for RF applications. The high permittivity of the material ($\varepsilon_r$>100) allows for reducing the size of devices. For example, in a standard 50-Ω RF system at low GHz frequencies, a typical BST resonator area is in the order of 0.001 $mm^2$ and a typical BST filter area is about 0.01 $mm^2$. Thus the resonator size is smaller by an order of magnitude than conventional AlN resonators. As mobile communication equipment such as smart-phones become ever more complicated, they require ever more filters, and this small filter size is thus very important. Furthermore, the power consumption of BST resonators and filters is negligible, even with a dc bias voltage across the device as necessary to operate it, due to the very small leakage current of thin film ferroelectric BST.

In prior art resonators, the lower electrode is first deposited and then the piezoelectric film is deposited thereon. Consequently, due to the high temperature fabrication of the piezoelectric film, refractory metals such as molybdenum, tungsten, platinum or gold are traditionally used for the lower electrode. It will be appreciated that these refractory metals have crystal mismatch for achieving single crystal $Ba_xSr_{(1-x)}TiO_3$ in a <111> orientation.

Furthermore, most of these metals have poor DC resistance, potentially lowering the Q factor of the filter.

Since in the present technology, the first electrode 22 is deposited onto the piezoelectric film, a wide range of metals may be used such as aluminum and/or titanium.

Figure 13:
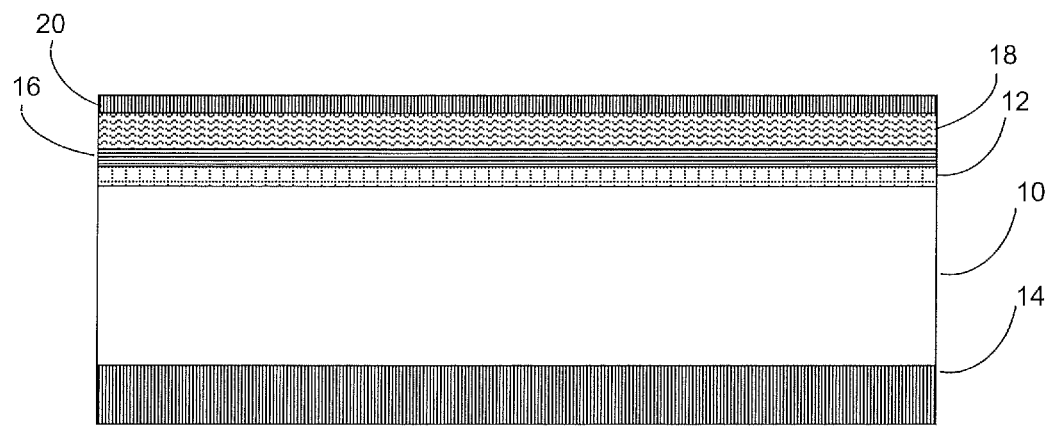
Figure 14:
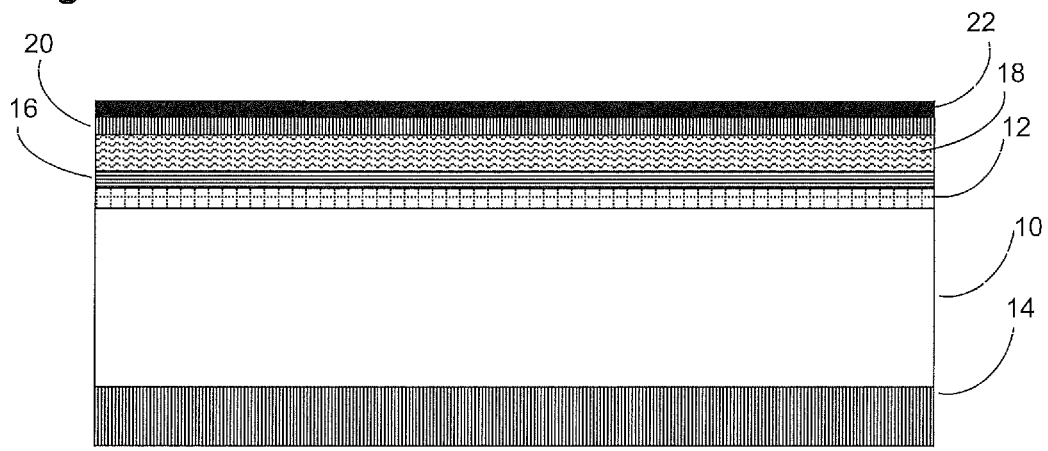

A first electrode layer 22 is now deposited over the piezoelectric membrane 10—step (c). With reference to FIG. 13, to aid adhesion, an adhesion layer 20 such as a titanium layer that may be as little as 5 nm thick, but could be as much as 50 nm is first deposited onto the $Ba_xSr_{(1-x)}TiO_3$ 18—step (ci). Then, with reference to FIG. 14, an aluminum electrode 22 of, say 100 nm to 150 nm is deposited thereover—step 3(cii). Both the adhesion layer 20 and the electrode 22 may be deposited by sputtering, for example. Tolerances of ±5% are acceptable and easily obtainable.

At a first approximation, the resonant frequency $f_R$ of a piezoelectric resonator is given by the following equation: $f_R = vL/2t$ where vL is the longitudinal acoustic velocity in the normal direction of the piezoelectric layer, t is the thickness of the piezoelectric film and $\lambda$ is the acoustic wavelength of the longitudinal wave.

However, in practice, the acoustic properties of the other layers of the resonator affect the resonator performance. In particular, the mass loading effect of the electrodes which tend to be made of heavy metals such as molybdenum and platinum, due to the need to withstand the fabrication temperature of the piezoelectric material.

Although described for depositing aluminum onto $Ba_xSr_{(1-x)}TiO_3$, it will be appreciated that PVD or CVD with otherwise, low density, high conductivity electrode materials 22 over different piezoelectric layers may be used with the same method. For example, carbon nano-tubes (CNT) over single crystal AlN or ZnO piezo films may be considered. Aluminum is particularly attractive for resonator electrodes since it has high electrical and thermal conductivity and a low density, so hardly lowers the overall Q factor of the resonator. However, previous manufacturing routes, wherein the electrode was deposited prior to deposition of the piezoelectric, ruled out aluminum.

The piezoelectric film 18, adhesion layer 20 and aluminum electrode 22 are deposited over the entire sapphire wafer 10 as a continuous layer.

Figure 15:
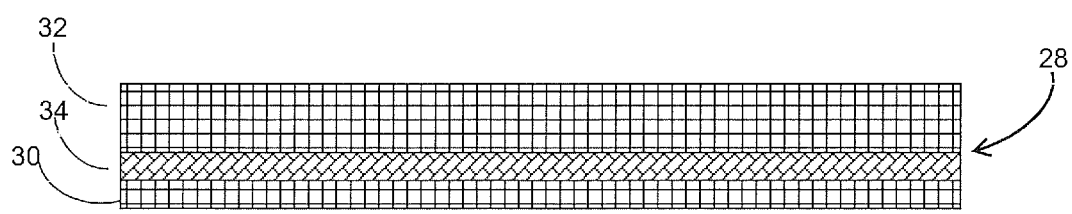

With reference to FIG. 15, a backing film on handle 28 is obtained—Step (d). This is a commercially available silicon on insulator (SOI) product. The backing film on handle 28 is typically a silicon wafer film 30 sandwiched to a silicon carrier 32 by a silicon oxide layer 34.

A commercially available backing film on handle 28 obtainable from KST World Corp™ (www.kstworld.co.jp) that is suitable is shown schematically in FIG. 3(d) and consists of a silicon film 30 that comes in thicknesses of the typical range 1.5 to 10 μm that is coupled by a SiO2 box 34 that is typically 10-20 μm thick to a Silicon handle 32 that is typically about 400 μm thick.

Figure 16:
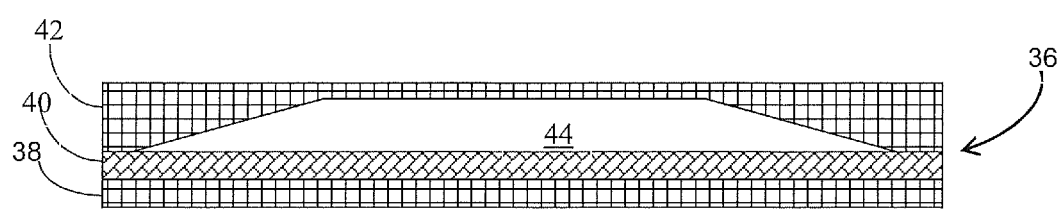

An alternative SOI product 36 shown in FIG. 16 is a silicon wafer 38 attached to a silicon carrier 42 by a silicon oxide layer 40, but with a preformed air cavity 44. Such a structure is commercially available from Icemos™ (www.icemostech.com).

Both SOI products 28, 36 may be obtained pre-coated with metal coatings on the silicon film 30, 38 aiding their attachment to the piezoelectric film-electrode sandwich.

Figure 17:
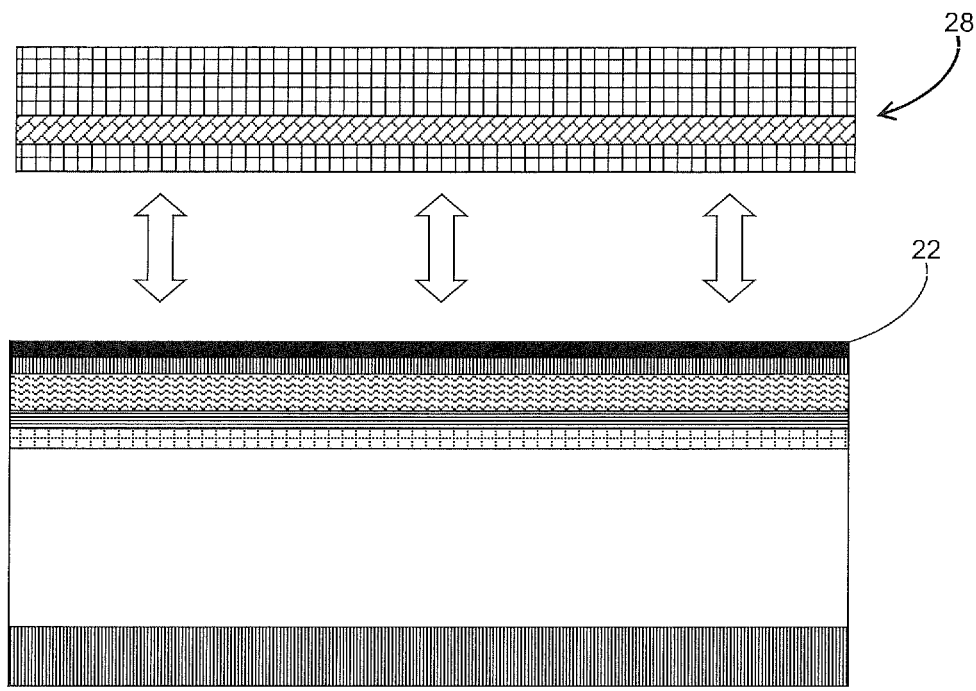
Figure 18:
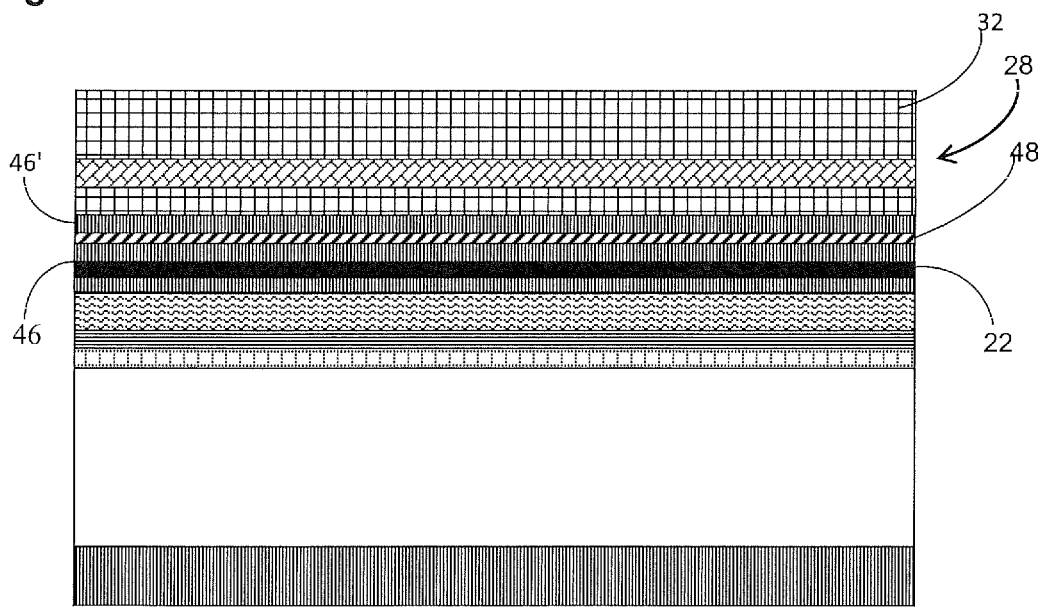

With reference to FIG. 17, the commercially available film 30 (38) on handle 32 (42) product 28 (36) is attached to the oxide layer 28 deposited over the electrode 22 of the stack—step (e).

There are a number of ways that the silicon film 30 (38) may be attached to the oxide layer 28. For example, with reference to FIG. 18 an adhesion layer such as titanium 46 may be deposited onto the electrode layer 22 and this can be coated with an adhesive layer consisting of a gold-indium eutectic alloy 48 comprising 0.6% gold and 99.4% indium. The Au—In eutectic melts at 156° C. and by hot pressing at about 200° C., the adhesion layer may be attached to the silicon membrane 30 of the SOI wafer 28. Optionally, a titanium bonding layer 46' is attached to the silicon membrane 30 and an adhesive layer of gold-indium eutectic alloy 48 is attached to this. The two adhesion layers are fused together by the hot processing.

Figure 19:
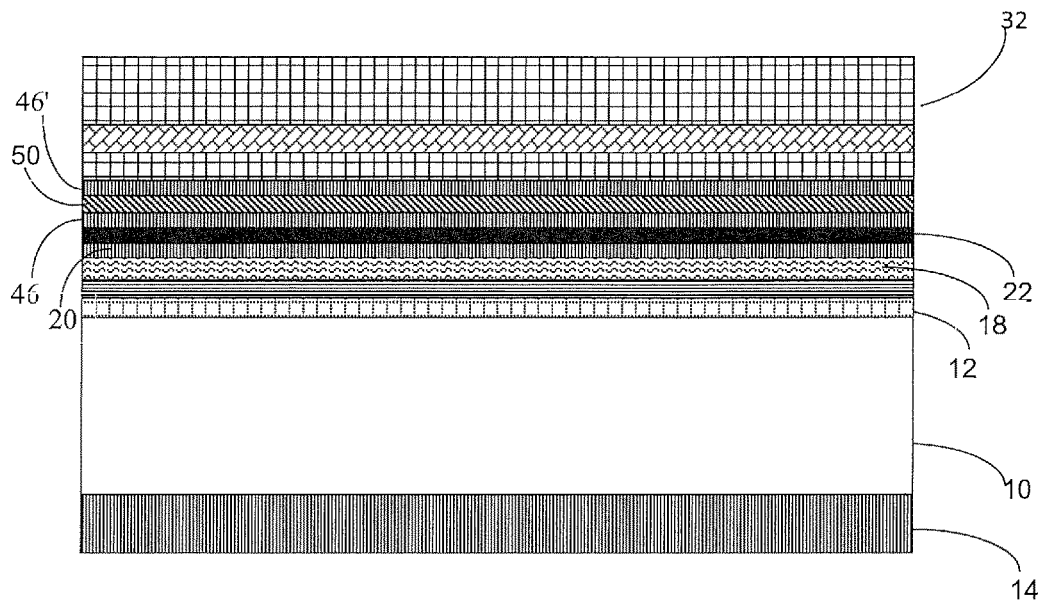
Figure 20:
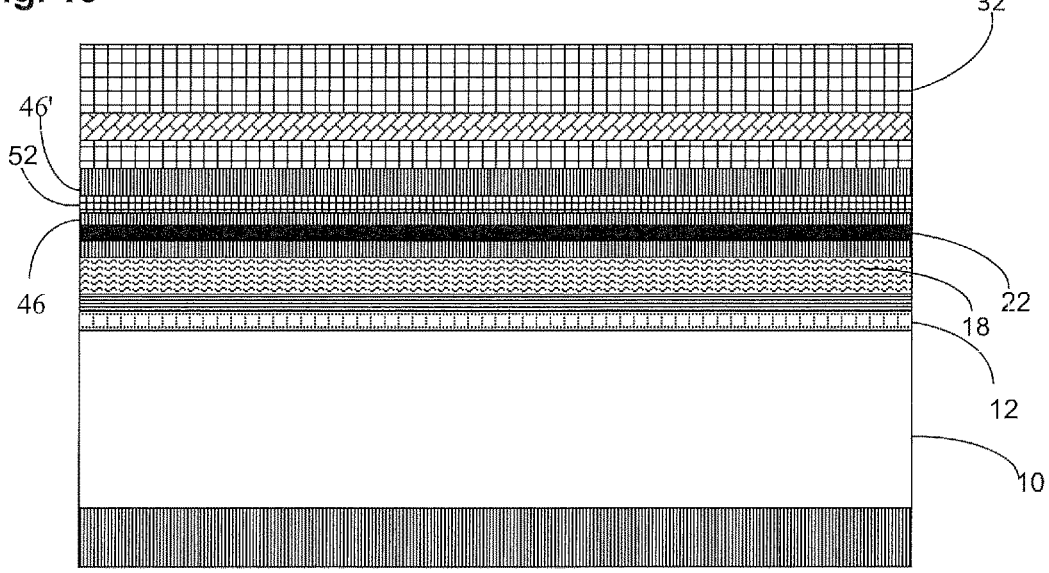
Figure 21:
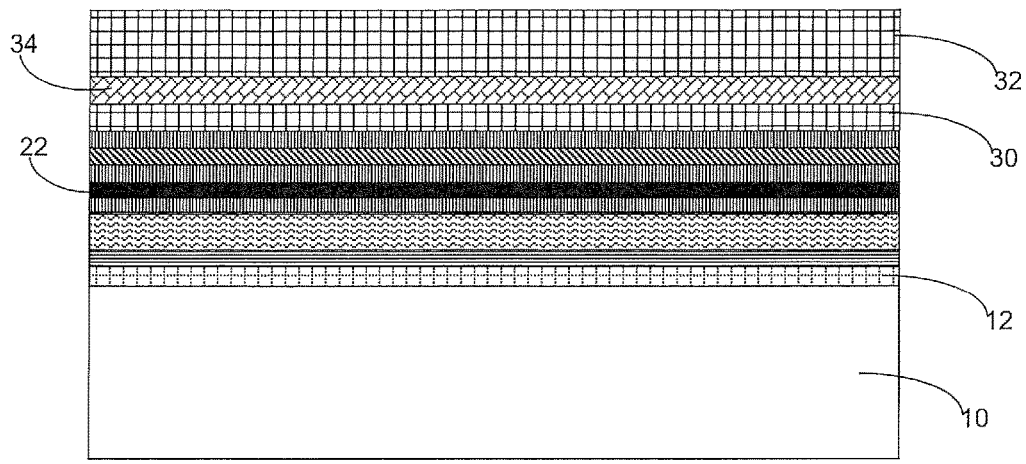
Figure 22:
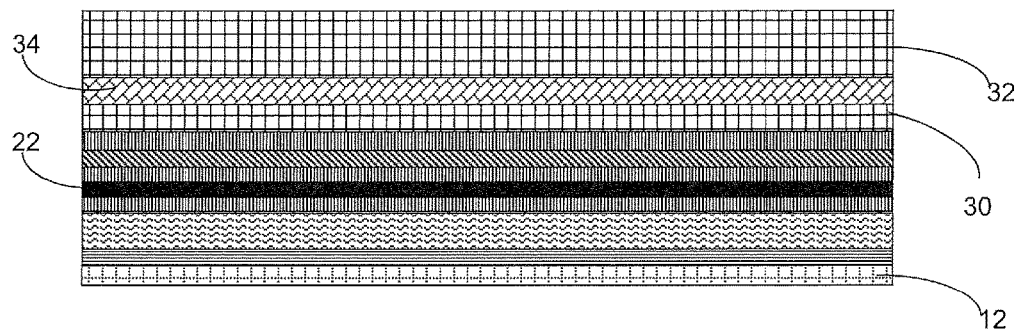

The process is capable of some variation. With reference to FIG. 19, an alternative process relies on the fact that both the exposed surface of the silicon wafer film 30 (38) and the surface of the electrode layer 22 are very smooth. By coating both surfaces with adhesion layers of titanium 46, 46' that are typically 2-4 nm thick and may be deposited by sputtering, and then depositing pure gold 50 (50') coatings of thicknesses of 10-40 nm onto the adhesion layers 46 (46') the two gold coatings 50, 50' may be brought together at room temperature and the coatings fused together (see for example Shimatsu, T. & Uomoto, M. (2010). "Atomic diffusion bonding of wafers with thin nanocrystalline metal films". Journal of Vacuum Science Technology B: Microelectronics and Nanometer Structures. 28 (4). pp. 706-714.). This technique requires a lower temperature and a thinner gold layer 50 than the Au—In eutectic used in variant step 3e'.

A further alternative process, shown in FIG. 20 is to again coat both surfaces with adhesion layers of titanium 46, 46' that are typically 2-4 nm thick, and then deposit aluminum nitride 52 (52') coatings having thicknesses of 10-40 nm onto the adhesion layers 46 (46'). The two aluminum nitride 52 (52') coatings may be activated with Ar plasma and when brought into contact at room temperature and pressure, fuse together. The bond can be strengthened by annealing at 300° C. in a $N_2$ atmosphere, typically for a period of 3 hr. It will be noted that AlN is itself a piezoelectric material.

It will be appreciated that the stack of titanium adhesion layers 20, 46, 46' and the gold-indium or gold bonding layers 48, 50 serve with the aluminum electrode 22 layer as the upper electrode. This composite electrode can take advantage of the inherent characteristics such as DC resistance, acoustic impedance and weight (density) of the different materials, to provide different properties to the composite electrode.

In general, it is advisable to process at as low a temperature as possible to minimize the likelihood of damage to the piezoelectric film and its electrodes and to further minimize warpage of the stack due to differences in the coefficient of thermal expansion of silicon and sapphire. It is further advised that the bonding layer thickness should be as thin as possible in order to enhance the Q factor value but that higher bonding layer thicknesses are also possible thorough careful balancing of the DC resistance, weight and acoustic impedances of the composite electrode.

Once the silicon film and handle 28 is attached, the sapphire substrate 10 may be removed—step (f). If a thermal layer such as titanium 14 is deposited on the back of the substrate, this may be removed by chemical mechanical polishing, for example—step (fi) giving the structure shown schematically in FIG. 21. Then, the GaN 12 may be irradiated through the sapphire substrate 10 using a 248 nm excimer laser to disassociate the GaN 12 enabling lift off of the aluminum substrate 10 (step (fii)). Such a pulsed laser, with a square waveform is available from IPG Photonics™. This process is known as laser lift off and results in the structure shown schematically in FIG. 22.

Figure 23:
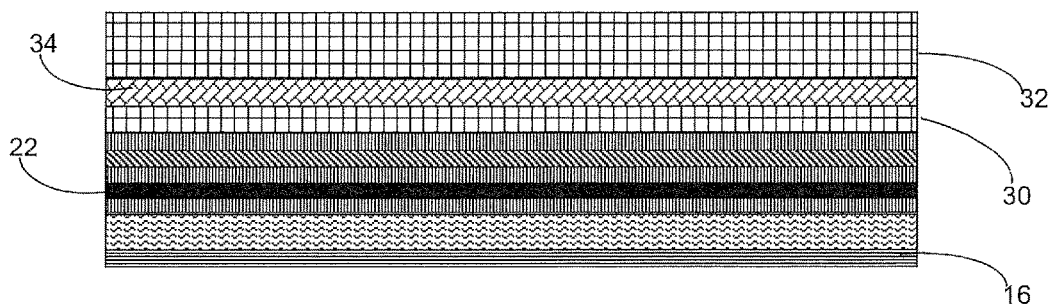
Figure 24:
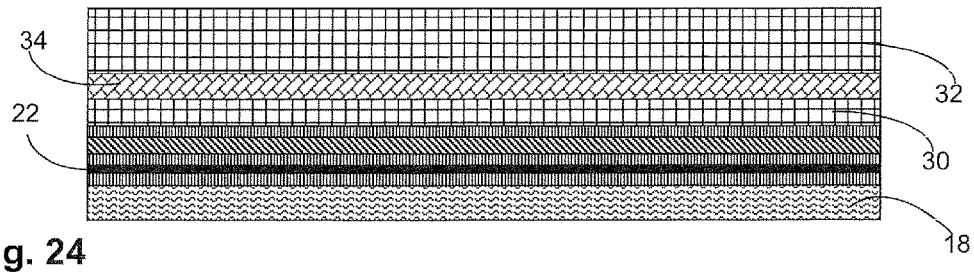
Figure 25:
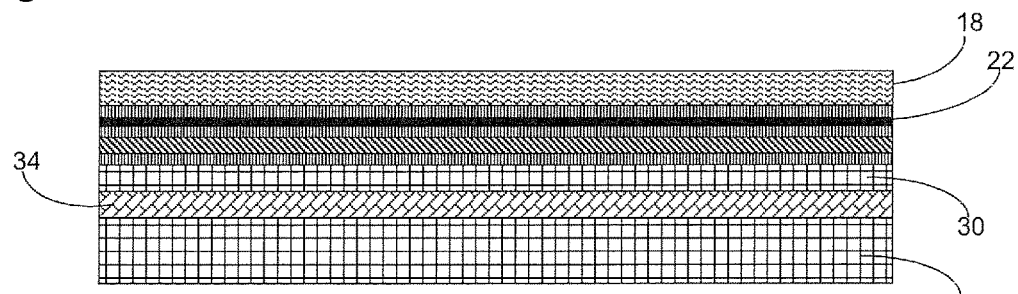

Residual GaN 10 may be removed using Inductively Coupled Plasma (ICP) with $Cl_2$, $BCl_3$ and Ar for example—Step (fiii), FIG. 23. This can be achieved at temperatures of below 150° C., avoiding heat treatment of the piezoelectric thin film 18 and of the aluminum 22 and other layers. The Inductively Coupled Plasma (ICP) is a commercially available process, used by NMC (North Microelectrics) China Tool and by SAMCO INC™, for example.

Since the U-GaN deposited coating 12 may be more Gallium rich near to the interface with the piezoelectric 18, a buffer layer 16 may be required to protect the piezoelectric. This is a further purpose of the $TiO_2$ rutile layer which may now be removed—step f(iv), shown in FIG. 24, for example by exposing to an inductively coupled plasma (ICP) using $N_2$:$CF_4$:Ar in a 6:16:4 sccm gas mixture.

After removing the $TiO_2$ buffer layer 16, a thickness measurement and trimming process of the piezoelectric film 18 may be required to obtain perfect frequency response which is related to the film thickness—step (g). The trimming process uses Ar+ Ion beam milling and this process may be used to tailor any metal adhesion, barrier or oxide layers such as $SiO_2$, $Al_2O_3$, AlN, W, Mo, Ta, Al, Cu, Ru, Ni or Fe where the wafers is held in a 4 axis chuck and rotated accordingly. A commercially available system known as InoScan™ is available from Meyer Burger™, Germany. The resultant structure (rotated) is shown schematically in FIG. 25.

Figure 26:
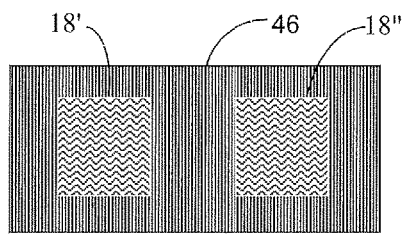
Figure 27:
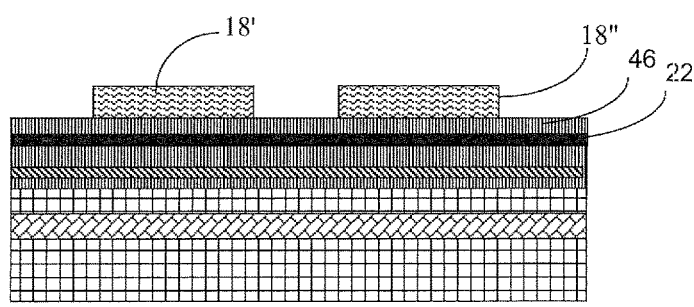

The same ICP process that is used to clean the back side of the piezoelectric 18 may then be used to pattern the piezoelectric layer 18 into arrays of piezoelectric islands for fabricating filters and the like—step (h). By way of example only, a schematic top view is shown in FIG. 26 and a side view in FIG. 27. Although rectangular islands of piezoelectric are shown, the islands may, of course, have any shape as dictated by the shape of the lithography mask tool.

An induction coupled plasma (ICP) using $Cl_2$+$BCl_3$+Ar is then applied to respectively remove the aluminum, adhesion layers, bonding layer, silicon wafer, silicon oxide and down about 10 microns into the silicon handle creating trenches 21—step (i) with end point detection being used to stop the process. This process operates at a temperature of less than 150° C. and does not adversely affect the piezoelectric membranes 18', 18" which are protected by the photo-resist mask. Inductively Coupled Plasma (ICP) is a commercially available process, used by NMC (Beijing North Microelectronics) China Tool and by SAMCO INC™, for example.

Figure 28:
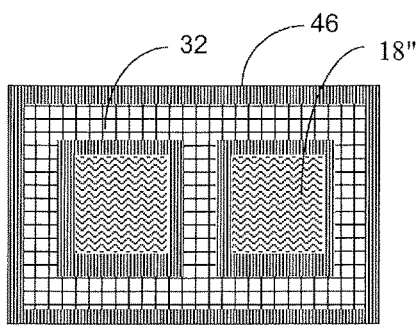
Figure 29:
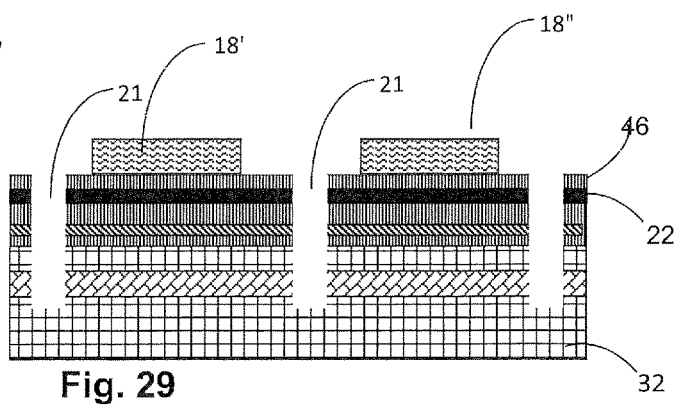

A schematic top view of the resulting structure is shown in FIG. 28 and a schematic side view is shown in FIG. 29.

Figure 30:
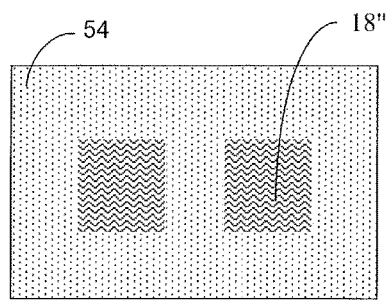
Figure 31:
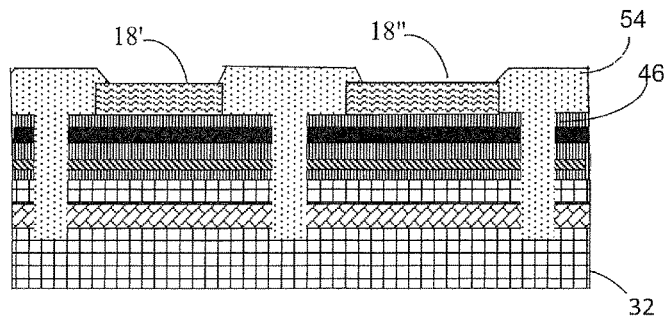
Figure 32:
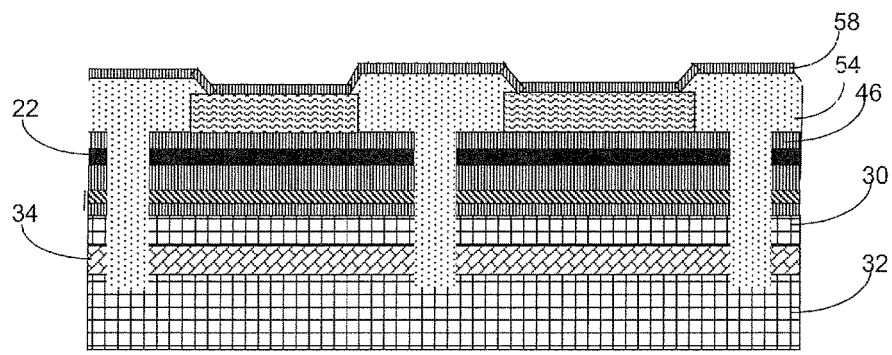
Figure 33:
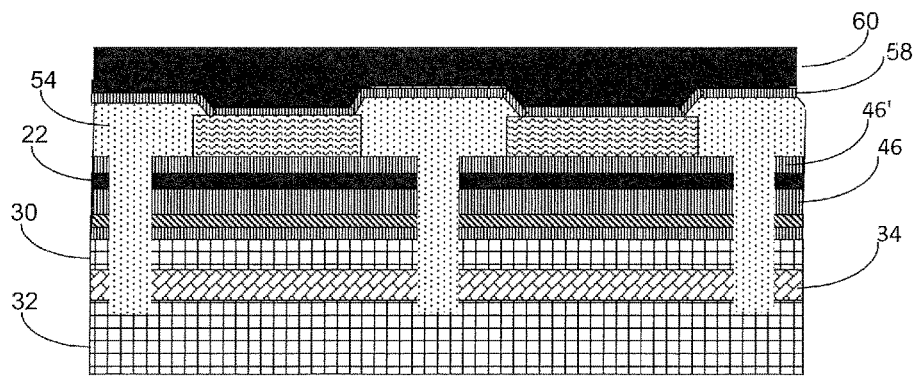
Figure 34:
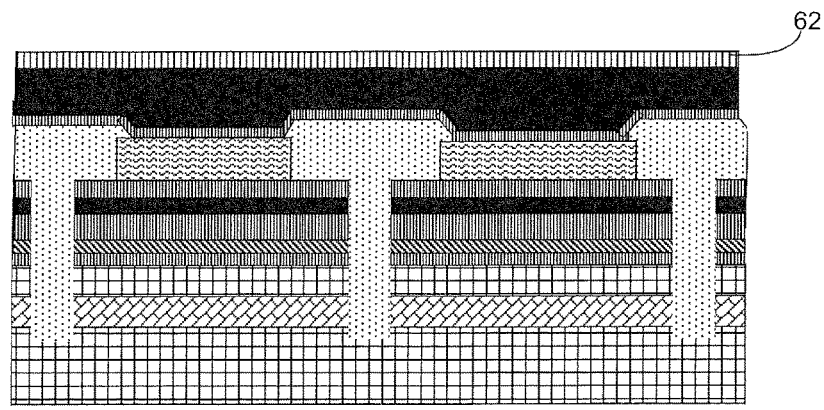

With reference to FIG. 30—schematic top view, and FIG. 31—schematic side view, a passivation layer such as a photo-sensitive Polyimide or BCB (Benzocyclobutene) is applied in the trenches 21 thus produced—step (j). The same passivation material 54 may be used to cover the piezoelectric islands 18', 18" with windows then being opened down through the passivation layer to the piezoelectric islands by selective exposure. This is a precision process that includes the known series of sub-processes such as spin-coat, exposure, development and cure of photo-sensitive polymer passivation layers. Photo-sensitive polyimide passivation materials are available from HD Microsystems™ and are a standard industry solution for Flip Chip and Wafer Level Chip Scale Packages (WL-CSP) devices such as that described in this specification. Photo-sensitive BCB is commercially available as Cyclotene™ from Dow Chemicals™.

The upper electrodes are now applied—step (k). An adhesion layer 58 such as titanium is first deposited—step (ki)—FIG. 32, and then the top electrode 60 is then deposited—step (kii)—FIG. 33. Both the adhesion layer 58 and the electrode 60 may be deposited by sputtering, for example. Tolerances of ±5% are acceptable and easily obtainable.

Couplings are now applied to connect the structure to an interposer, described below. Firstly, an Under Bump Metallization (UBM) layer 62 may now be applied—step (l) by depositing a layer of metal that may be titanium (typically about 500 Angstroms), Ti/W (typically about 500 Angstroms titanium, followed by about 750 Angstroms of tungsten). or Ti/Ta (typically about 500 Angstroms titanium, followed by about 1000 Angstroms of tantalum—step (l)i, FIG. 34. Sputtering or PVD may be used.

Figure 35:
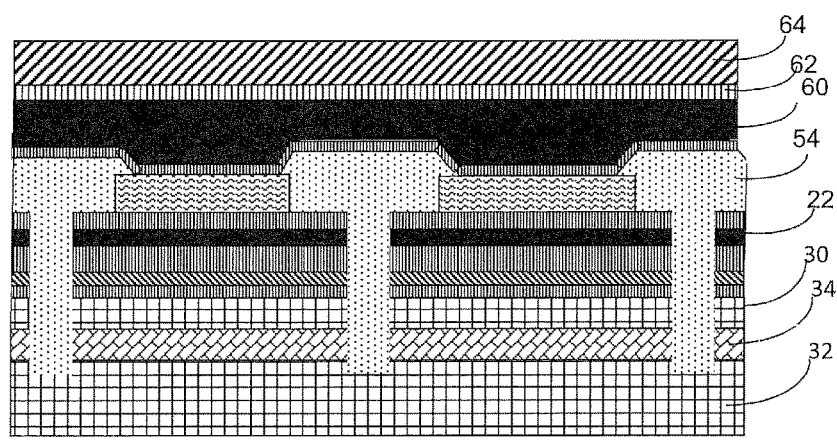

The structure may then be covered with a layer of copper 64 that is typically about 1 μm thick, by sputtering, for example—step (l)ii—see FIG. 35; the Under Bump Metallization layer 62 keeps the copper 64 and aluminum 60 separate.

Figure 36:
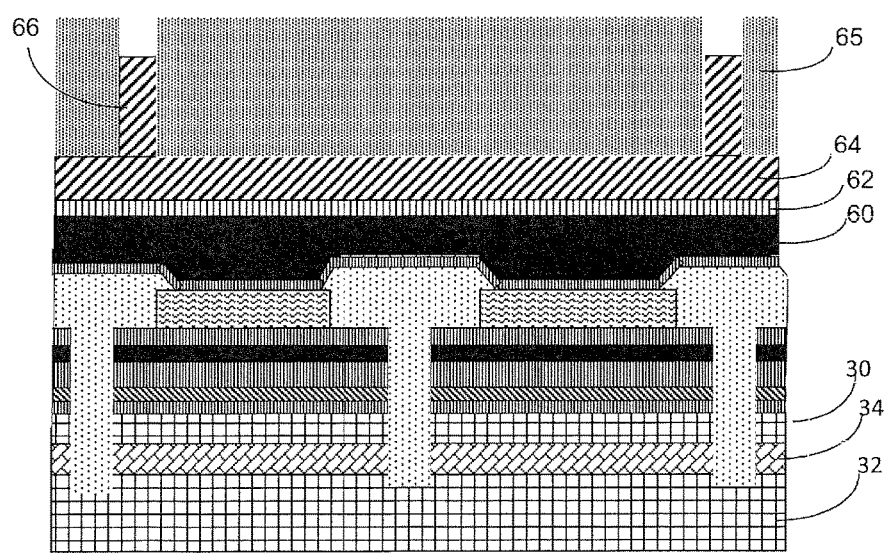

Next, copper pillars 66 may be fabricated—step l(iii), FIG. 36. These are typically about 40-50 μm in diameter and about 40 μm high. They may be fabricated by depositing a layer of photoresist 65, patterning and then electroplating copper 66 into the pattern.

Figure 37:
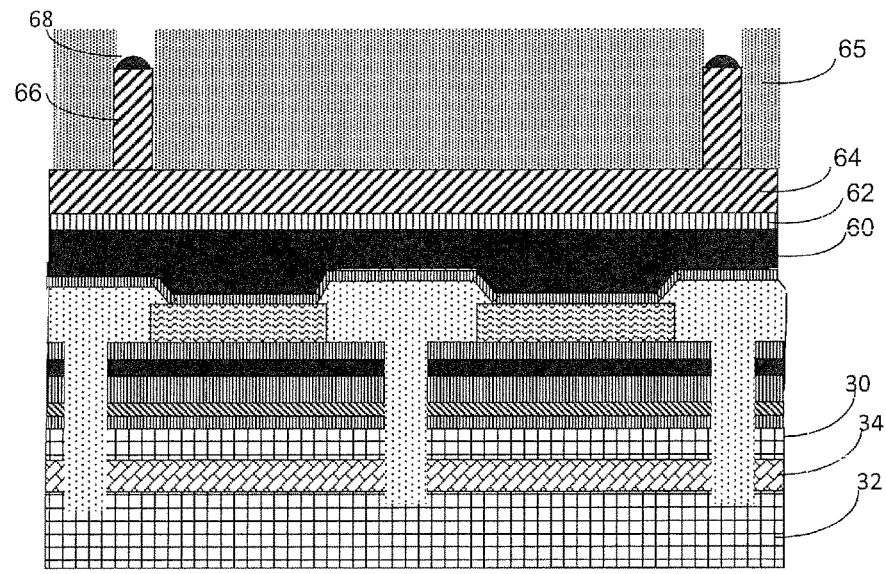
Figure 38:
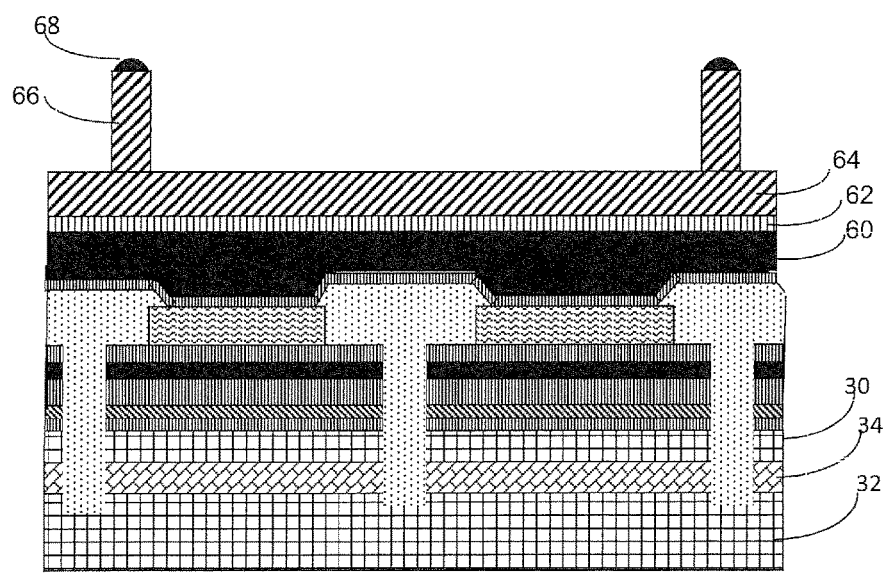

Solder 68 may then be deposited into the pattern to cap the copper pillars 66—step l(iv) (FIG. 37). This could be achieved by electroplating or electro-less plating a suitable material into the photoresist pattern used for fabricating the copper pillars 66. Then the photoresist is stripped away—step (l)v, FIG. 38.

Figure 39:
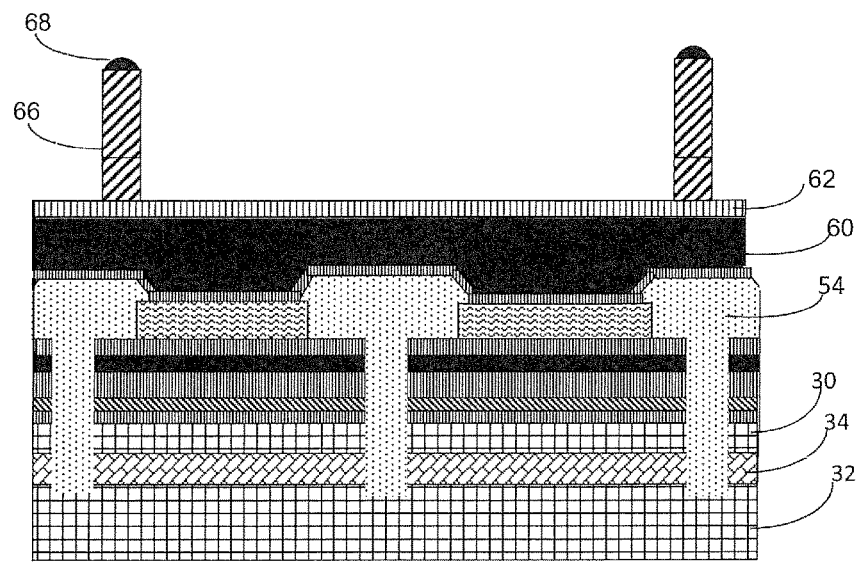
Figure 40:
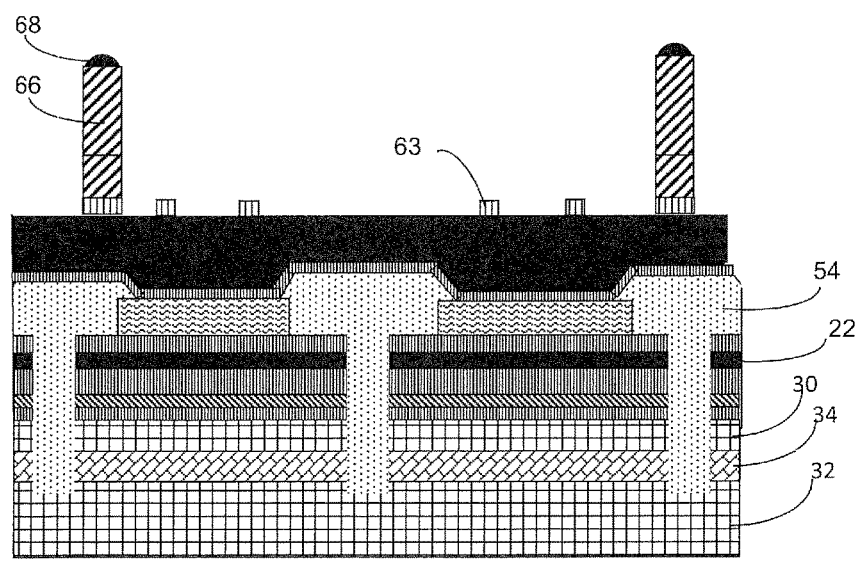

The copper layer 64 around the copper pillars 66 is now etched away—step l(vi), FIG. 39. This may be accomplished by exposing to a solution of ammonium hydroxide at an elevated temperature. Alternatively, copper chloride or other commercially available Cu micro-etch solution may be used as the etchant. The UBM 62 is now selectively removed—step (l)vii, FIG. 40, leaving perimeter sections 63 over what will become the edges of the upper electrode to add weight to the edges of the effective resonators. Such "raised frame" structure is especially effective in Composite FBARs to help minimize lateral-wave spurious modes that otherwise lower the Q factor of the device, regardless of the mode number. With such structures, only the main lateral mode is excited due to the new boundary conditions created by the raised frame between the active and outside region of the resonator membrane 18. Thus, with reference to FIG. 41, by way of schematic illustration only, top and side views of a pair of piezoelectric capacitors coupled in parallel is shown, and with reference to FIG. 42, by way of schematic illustration only, top and side views of a pair of piezoelectric capacitors coupled in series is shown. The superfluous aluminum 60 beyond that required for the electrode may be selectively removed by applying an inductively coupled plasma comprising $Cl_2+BCl_3+Ar$ and the excess parts of the titanium adhesion layer 58 thereby exposed may be selectively removed by reactive induction etching away with $SF_6$ and $O_2$.

Figure 43:
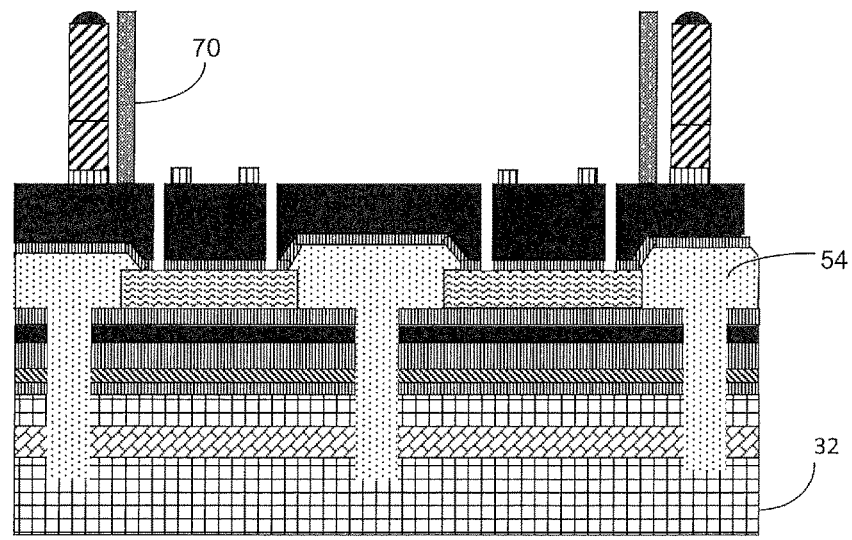

With reference to FIG. 43, a polymer gasket 70 may now be fabricated around an array or resonators defining a filter—Step (n). This may be achieved using SU-8 technology. SU-8 is a commonly used epoxy-based negative photoresist whereby the parts exposed to UV become cross-linked, while the remainder of the film remains soluble and can be washed away during development. SU8 can be deposited as a viscous polymer that can be spun or spread over a thickness ranging from below 1 µm to beyond 300 µm. It is an attractive material since it can be deposited as a tall thin wall that can be about 55 µm high and thus compatible with the solder capped copper pillars, whilst having a width of from 10 to 30 µm.

Figure 44:
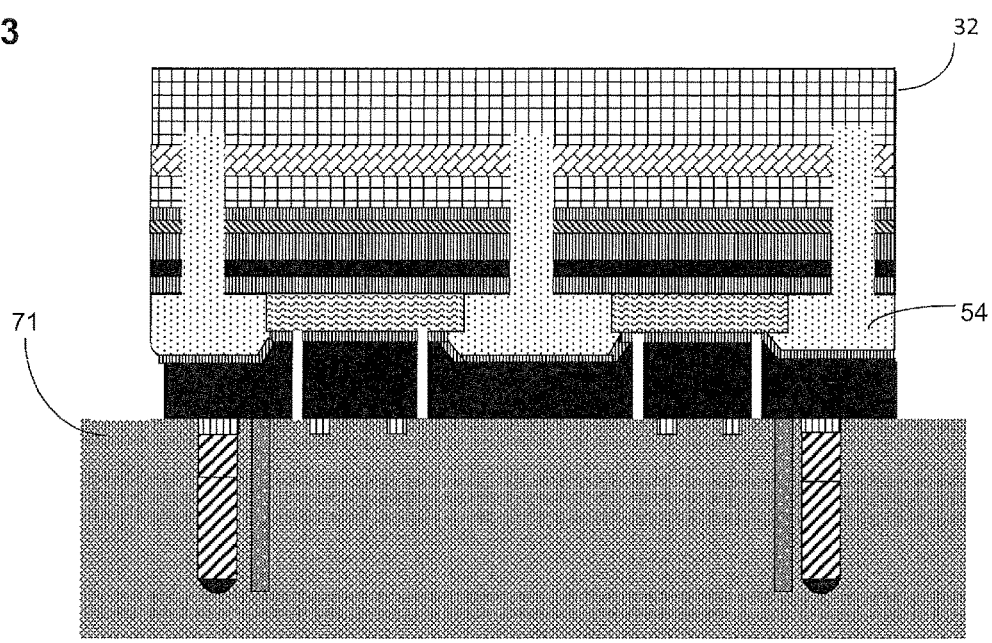
Figure 45:
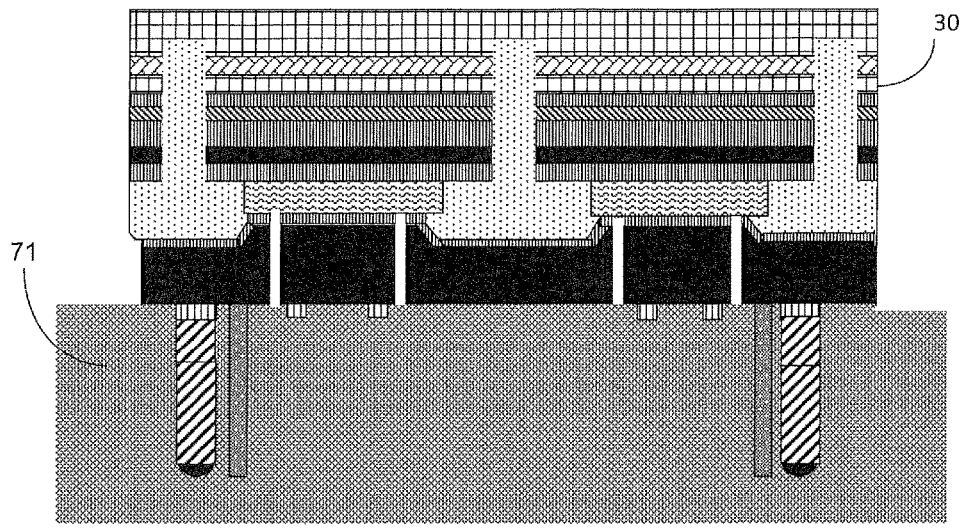
Figure 46:
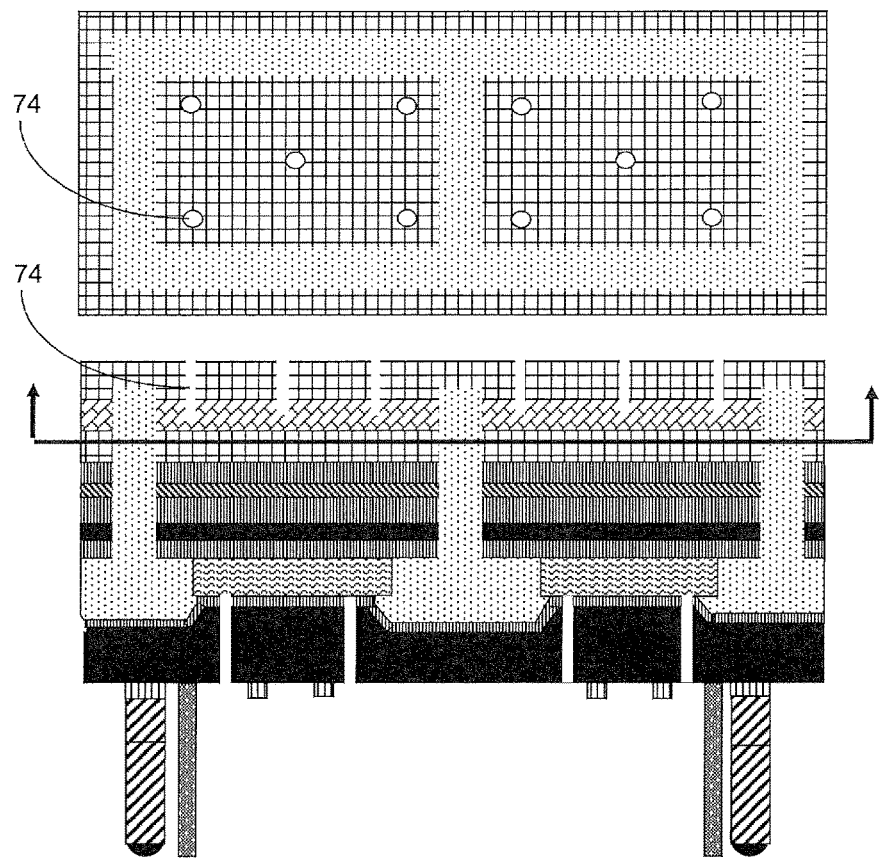
Figure 47:
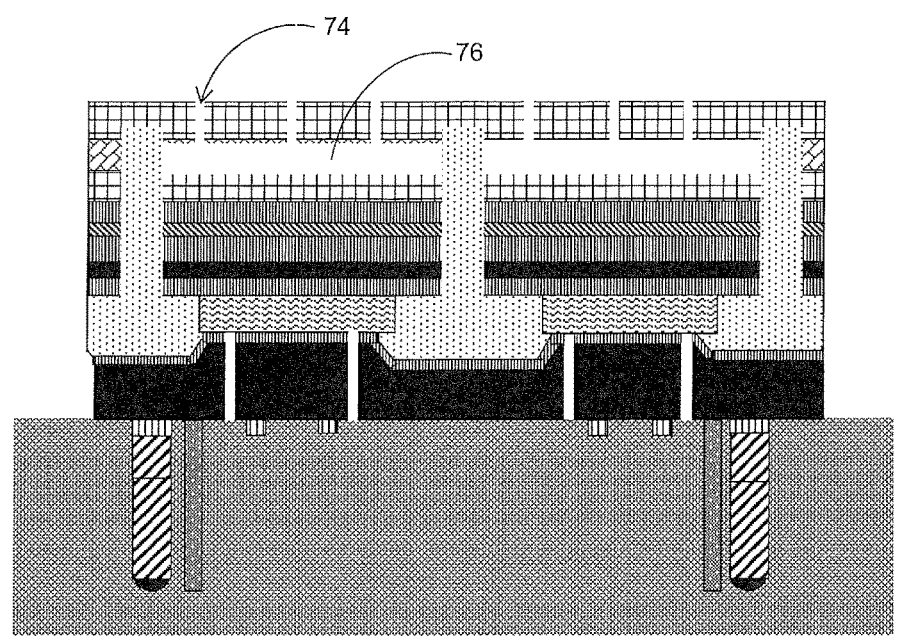

At this stage, as shown in FIG. 44, the array of filters may be attached to a tape 72 with the copper pillars 66 and SU8 gasket 70 side facing downwards, and the silicon handle 32 may be thinned down to about 90 microns—step (o), using chemical mechanical polishing (CMP), to produce the structure shown in FIG. 45. Other possible thinning techniques include mechanical grinding, chemical polishing, wet etching together with atmospheric downstream plasma (ADP) and dry chemical etching (DCE), for example, Unless a SOI substrate 36 having prefabricated cavities 44—FIG. 16—was used, cavities 76 are now formed in the $SiO_2$ 34 layer—step (p). Through silicon via etching (TSV) is used to drill holes 74 through the thinned down silicon handle 32 to the $SiO_2$ box 34—step (p)i, FIG. 46 opposite each of the piezoelectric films 18', 18". The Silicon Oxide 34 may then be selectively etched away with HF vapor in accordance with the formula $SiO_2+4\ HF(g) \rightarrow SiF(g)+H_2O$ through the silicon via holes 74 to form cavities 76, with the passivation layer that bridges the gap between the silicon wafer 30 and the silicon handle 32, through the silicon dioxide layer 34 acting as an etch stop and defining the side walls of the cavities thus filled—step p(ii), FIG. 47. Dry vapor etching is preferable to a wet etch since this enables penetration of small features and prevents the membrane and cover from sticking together.

Up until this stage, the filters are fabricated in arrays using on wafer fabrication techniques. The array is now diced into separate filter units—step (q).

Dicing may take place by mechanical blades, plasma or laser. Plasma or laser may be preferred with some designs in order to avoid membrane damages. Such dicing tools are available by Disco™ Japan.

Figure 48:
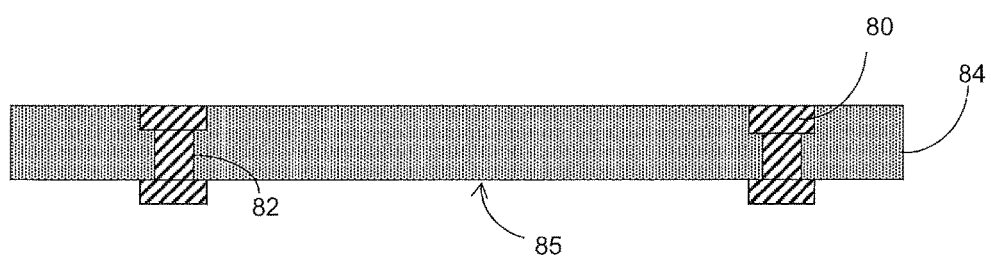

An interposer 85 is now procured step (r), FIG. 48. By way of enablement only, a two layer interposer 80 may be fabricated by copper electroplating of pads 80 and vias 82 into photoresist on a sacrificial copper substrate, followed by laminating with a dielectric material 84 having a polymer matrix such as polyimide, epoxy or BT (Bismaleimide/Triazine), Polyphenylene Ether (PPE), Polyphenylene Oxide (PPO) or their blends, either provided as a film, or as a pre-preg reinforced with glass fibers for additional stiffness. More details may be found in U.S. Pat. No. 7,682,972 to Hurwitz et al. titled "Advanced multilayer coreless structures and method for their fabrication" incorporated herein by reference. There are, however, alternative established manufacturing routes for fabricating appropriate interposers. An appropriate interposer 85 with copper pads 80 and vias 82 in a dielectric with polymer matrix 84 is shown in FIG. 48.

If the technology of U.S. Pat. No. 7,682,972 to Hurwitz et al. is used, it may be preferable to attach the resonator to the interposer and then to encapsulate them prior to removing the sacrificial copper substrate by etching it away.

In general, the interposer 85 should be thin so that the overall package remains thin. However, it will be appreciated that different resonators 18', 18" may be interconnected via routing layers within the interposer 85, and additional layers may be built up if r.

Figure 49:
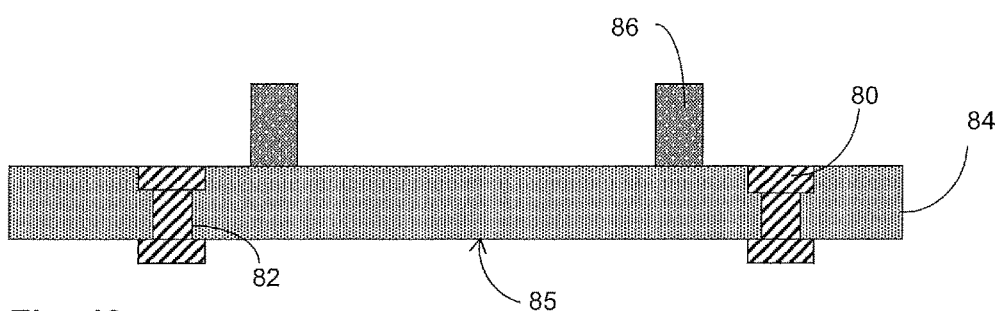

With reference to FIG. 49, usefully an epoxy dam structure 86 may first be deposited on the interposer surface—step (s). The epoxy dam structure 86 may be fabricated by silk-screening an epoxy polymer, or by laminating a dry-film epoxy dam barrier that is photo-imageable. The last method is preferred as it provides high position accuracy with respect to the SU8 gasket 70 on the filter die. It should be noted that dry films may be deposited in several layers to achieve desired thicknesses. As with the gasket 70 around each filter array, the dam 86 could also be fabricated from SU-8. The dam 86 is designed to fit around the gasket 70 and could be slightly larger or smaller in area than the area surrounded by the gasket 70 to be positioned on the inside or outside of the gasket 70. Indeed two dams 86 (one encircling and the encircled by the gasket) or a plurality of gaskets 70 could be provided.

Figure 50:
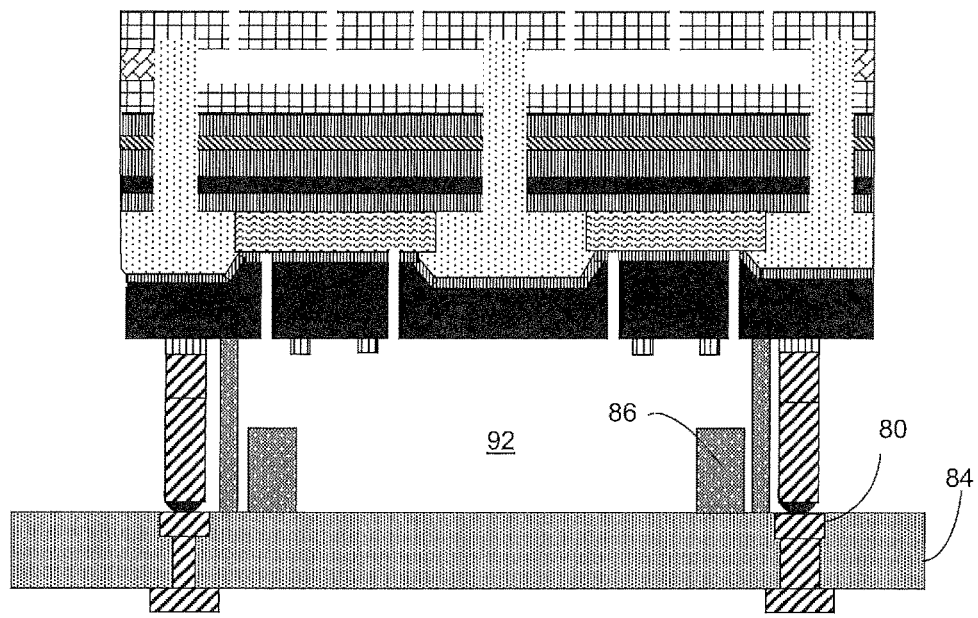

As shown in FIG. 50, the interposer may then be attached to the Composite FBAR resonator array by aligning and melting the solder caps 68 on the copper pillars 66—step (t).

Figure 51:
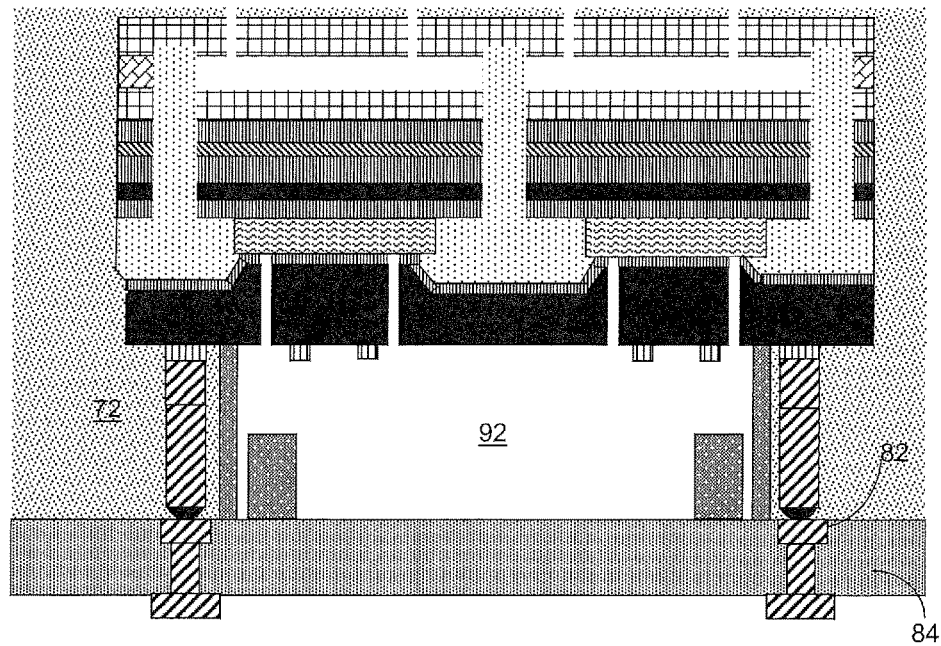
Figure 52:
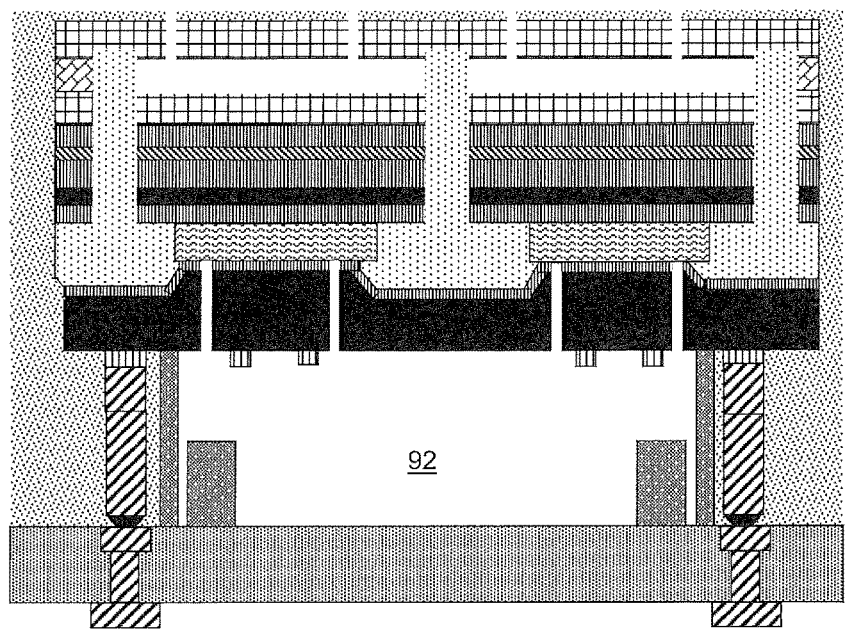

The array device may be encapsulated in polymer 90—step (u); the dams 86 and SU8 gaskets 70 working together preventing under fill of the cavity 92 within the gasket 70 giving the structure of FIG. 51.

In this manner, the closely aligned SU8 connected to the Composite FBAR array and the epoxy dam connected to the substrate prevents under-fill 72 from filling the cavity 92 under the piezo resonators 18', 18".

The array of resonators is then diced into separate filter modules—step (v), FIG. (52) for testing, packaging and shipment.

The interposer 85 may be a functional substrate with embedded inductors, lines and couplers. It should be noted the due to the small form factor dimensions of the described BST FBAR filter as described above, the interposer 85 may subsequently be placed on the same IC Substrate together with controllers, power amplifiers and switches to generate a fully integrated Front End Module (FEM). This allows all components to be designed together to achieve optimum system performance.

Thus single crystal BST Composite FBARs are shown and described.

Due to its high Dielectric constant, when the bias voltage is zero, the Single Crystal BST FBAR becomes a very low leakage capacitor so it can act as a switch.

Consequently the Single Crystal BST FBAR will only resonate at a specific voltage. This potentially enables the elimination of switches from the FEM which currently includes filters, power amplifiers, switches and controllers, thereby simplifying and lowering the cost of the FEM, it being appreciated that BST switches are known to operate at very fast speeds, over trillions of cycles with very low leakage currents.

In resonator/filter designs with aluminum electrodes, the top electrode may be split into two sections: the Al electrode itself and a separated Al line that runs bias voltage to the BST and causes it to resonate. This bias voltage is usually between 5V to 40V, the voltage depending on the resonator frequency. For example, Tests performed on 2700 Å Piezo thick BST at 19V have caused the BST to resonate at 6.5 GHz.

Single crystal BST FBAR Filters are potentially tunable using capacitors build around the filter on the same silicon carrier. It has been established by numerous research groups that single crystal BST has a tunability ratio of 1:8 or even 1:10 whereas amorphous or polycrystalline BST has only has 1:3 to 1:4 tunability.

Single crystal BST FBAR resonators and thus filters have the following advantages:

Due to their dielectric constant single crystal BST FBAR resonators (and thus filters) are smaller than AN.

Such BST FBAR filters are "switchable" as they resonate only by applying certain DC voltage.

Matching and adjusting rejection rates through tunable BST capacitors build as part of the FBAR filter or as part of an entire BST filter bank circuitry is possible since the process to build a tunable BST capacitor and a BST FBAR resonator is fundamentally the same.

Single crystal BST FBAR resonator can save up to 40% of the RF power wasted as heat in prior art filters because the single crystal orientation enables polarization of the excited acoustic wave.

The single crystal BST FBARs disclosed herein can operate at higher frequencies since the thickness of the ultra-thin BST Piezo necessary for high frequencies is supported by an additional membrane (composite FBAR).

Single crystal BST FBARs disclosed herein use processes and FABs developed for LED manufacturing rather than dedicated and expensive Si FABs. This reduces the investment and total cost to manufacture the filter device. LED fabrication processes are well understood and as such yields are higher than standard FBAR processes.

Single crystal BST FBARs manufacturing processes disclosed herein use the low cost back-end processes well established and with high yields available by multiple wafer bumping and assembly houses.

Although discussed hereinabove with reference to communication filters, it will be appreciated that thickness-shear-based Composite FBARs and surface generated acoustic wave-based Composite FBARs are also used in other applications. For example they are widely used in biosensors since they provide high sensitivity for the detection of biomolecules in liquids.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

The invention claimed is:

1. A method of fabricating an RF filter comprising an array of resonators comprising the steps of:
    (a) Obtaining a removable carrier with release layer;
    (b) Growing a piezoelectric film on a removable carrier;
    (c) Applying a first electrode to the piezoelectric film;
    (d) Obtaining a backing membrane on a cover, with or without prefabricated cavities between the backing film and cover;
    (e) Attaching the backing membrane to the first electrode;
    (f) Detaching the removable carrier;
    (g) Measuring and trimming the piezoelectric film as necessary;
    (h) Selectively etching away the piezoelectric layer to fabricate discrete resonator islands;
    (i) Etching down through coatings, backing membrane, silicon dioxide and into silicon cover to form trenches;
    (j) Applying passivation layer into the trenches and around the piezoelectric islands;
    (k) Depositing a second electrode layer over the piezoelectric film islands and surrounding passivation layer;
    (l) Applying connections for subsequent electrical coupling to an interposer;
    (m) Selectively removing second electrode material leaving coupled resonator arrays;
    (n) Creating a gasket around perimeter of the resonator array;
    (o) Thinning down cover to desired thickness;
    (p) Optionally fabricating cavities between the backing membrane and cover;
    (q) Dicing the wafer into flip chip single unit filter arrays;
    (r) Obtaining an interposer;
    (s) Optionally applying a dam to the interposer surface to halt overfill flow;
    (t) Coupling the flip chip single unit filter array to pads of the interposer by reflow of the solder cap;
    (u) Encapsulating with polymer overfill; and
    (v) Singulating into separate filter modules.

2. The method of claim 1, wherein the removable carrier with release layer of step (a) comprises a single crystal sapphire substrate with a GaN release layer.

3. The method of claim 1, wherein the piezoelectric film comprises $Ba_xSr_{(1-x)}TiO_3$ (BST).

4. The method of claim 1, wherein the piezoelectric layer comprises a single crystal layer in a <111> orientation.

5. The method of claim 1, wherein the piezoelectric layer comprises the removable carrier is characterized by at least one of the following limitations:
    the removable carrier comprises sapphire;
    the removable carrier comprises a release coating of GaN;
    the removable carrier is a C-axis <0001> with a tolerance of ±1%;
    the removable carrier is a commercially available sapphire C-axis <0001> single crystal wafer with a un-doped GaN having C-axis <0001> with a tolerance of ±1° orientation.

6. The method of claim 1, wherein step (b) comprises at least one preliminary step selected from step (bi) of depositing a heat dissipating onto reverse side of the carrier to aid heat dissipation during the deposition of the piezoelectric layer, and step (bii) of depositing a buffer layer of rutile c-axis <100> $TiO_2$ and/or a <111> $SrTiO_3$ layer over the removable carrier prior to depositing the piezoelectric.

7. The method of claim 6 wherein the rutile c-axis <100> $TiO_2$ and/or the <111> $SrTiO_3$ layer is deposited by molecular beam epitaxy.

8. The method of claim 1 wherein step (b) of fabricating the piezoelectric film comprises depositing by molecular beam epitaxy.

9. The method of claim 1, wherein step (c) comprises depositing a first electrode of aluminum onto the piezoelectric film.

10. The method of claim 9, comprising one of the following limitations:
(i) the aluminum electrode is 100 nm±5 nm to 150 nm±5 nm thick;
(ii) the aluminum electrode is deposited by PVD;
(iii) step (c) further comprises a preliminary step (ci) of depositing an adhesion layer onto the piezoelectric film to aid adhesion of the aluminum characterized by at least one of:
the adhesion layer comprises titanium;
the adhesion layer is 5-50 nm±5% thick, and
the adhesion layer is deposited by PVD.

11. The method of claim 1, wherein the backing membrane on cover of step (d) comprises a silicon membrane attached to a silicon cover by a silicon oxide layer optionally further comprising preformed cavities between the silicon membrane and the silicon cover.

12. The method of claim 1 wherein step (e) of attaching the backing membrane on cover comprises depositing an adhesion layer and a bonding layer to the first electrode, and attaching an adhesion layer and bonding layer to the silicon membrane.

13. The method of claim 12 having at least one of the following limitations:
(i) the adhesion layer comprises titanium;
(ii) the adhesion layer comprises titanium deposited by sputtering and removable with dilute hydrofluoric acid and/or with $CF_4/O_2$ Plasma
(iii) the bonding layers are identical and may each comprise Au—In, Au or AN.

14. The method of claim 1 wherein step (f) of detaching the wafer carrier comprises laser lift-off.

15. The method of claim 14 wherein the wafer carrier comprises a sapphire single crystal wafer coated with GaN and the laser lift off comprises irradiating the GaN through the sapphire using a 248 nm excimer square waveform laser.

16. The method of claim 14 wherein step (f) further comprises at least one of:
(i) removing GaN and any barrier layer by induction coupled plasma, and
(ii) wherein if a heat dissipating layer was applied to the reverse of the sapphire carrier to aid deposition of an epitaxial single crystal piezoelectric, first removing said heat dissipating layer by at least one of chemical etching, mechanical polishing and chemical mechanical polishing (CMP).

17. The method of claim 1 wherein step (g) of trimming the piezoelectric membrane to a desired thickness comprises applying a scanning surface ion milling process over the surface of the piezoelectric membrane.

18. The method of claim 1 wherein step (h) of selectively etching away the piezoelectric layer to fabricate discrete resonator islands comprises etching with an induction coupled plasma.

19. The method of claim 1 wherein the step (i) of selectively removing coatings, adhesion layer, electrode, silicon and silicon oxide down into the cover comprises at least one of inductive plasma etching and reactive ion etching.

20. The method of claim 1 wherein step (j) of applying the passivation layer comprises:
filling trenches and surrounding piezoelectric islands with photo-sensitive Polyimide or Benzocyclobutene (BCB) by spin-coating followed by selectively exposing and developing the Polyimide or Benzocyclobutene (BCB) on the piezoelectric islands top surfaces.

21. The method of claim 1 wherein step (k) of applying a second electrode comprises depositing an adhesion layer of titanium followed by depositing an aluminum electrode by PVD.

22. The method of claim 1 wherein step (l) comprises at least some of the following steps:
Applying Under Bump Metallization (UBM) coating;
Applying a layer of copper over the (UBM) coating;
Fabricating copper pillars over the layer of copper;
Applying solder caps to the copper pillars;
Etching away excess copper and UBM away from copper pillars.

23. The method of claim 22 wherein at least one of the following limitations is true:
applying an Under Bump Metallization (UBM) coating comprises applying one of a titanium coating, a tungsten coating, a Ti/W coating and a Ti/Ta coating, wherein said UBM coating has a thickness of between 500 nm and 1500 nm thick;
applying a layer of copper over UBM coating by sputtering;
fabricating copper pillars over the layer of copper and covering with solder by laying down a layer of photoresist, developing to form a negative pattern of pillars, electroplating copper into the pattern to required height, electroplating solder caps onto the copper pillars, and removing the photoresist leaving upstanding copper pillars with solder caps;
Removing the excess copper and the UBM away from copper pillars comprises one of:
exposing to an induction coupled plasma;
exposing to Ferric chloride based solution;
exposing to Ammonium Persulfate based etchant.

24. The method of claim 1 wherein step (m) of selectively removing the upper electrode material comprises applying an inductively coupled plasma comprising $Cl_2+BCl_3+Ar$ to remove the aluminum and selectively reactive induction etching away the titanium with $CF_4$ or $SF_6$ and $O_2$.

25. The method of claim 1 wherein in step (l) the UBM layer is also selectively retained around perimeter of what becomes the upper electrode after step (m).

26. The method of claim 1 wherein step (n) of creating a gasket comprises at least one of fabricating a SU8 polymer wall around perimeter of the resonator array, and fabricating an epoxy dam on the interposer to define a lower surface of bottom cavity.

27. The method of claim 1 wherein step (o) of thinning down the cover comprises at least technique selected from the group comprising mechanical grinding, chemical mechanical polishing, wet etching with atmospheric downstream plasma (ADP) and dry chemical etching (DCE).

28. The method of claim 1 wherein the backing membrane and cover comprise a silicon wafer membrane coupled to a silicon handle by silicon oxide and step (p) comprises applying a through silicon via etch to create through silicon vias in the silicon cover through to the silicon dioxide layer, and undercut etching away the $SiO_2$ with HF vapor to create cavities behind the silicon membrane that are bordered by the passivation layer and aligned with the piezoelectric resonator films.

29. The method of claim 1 where the backing membrane and cover comprises a silicon film coupled to a silicon handle by silicon dioxide, with pre-formed cavities between the silicon film and the silicon cover, and the pre-formed cavities are carefully aligned with the piezoelectric islands.

30. The method of claim 1 where the step (r) of fabricating an interposer with routing layers comprises the steps of:
- (i) depositing an etch-resistant barrier layer of onto a sacrificial copper substrate;
- (ii) sputtering a copper seed layer;
- (iii) applying a first layer of photo resist to a carrier;
- (iv) patterning an array of pads;
- (v) electroplating copper into the patterned array;
- (vi) stripping photo resist;
- (vii) applying a second thicker layer of photo resist;
- (viii) patterning an array of via posts;
- (ix) electroplating copper into the array of via posts;
- (x) stripping away the second thicker layer of photo resist;
- (xi) laminating with polymer film or glass fiber in polymer prepreg;
- (xii) curing the polymer film or glass fiber in polymer prepreg;
- (xiii) polishing to expose ends of copper via posts;
- (xiv) optionally repeating steps (ii) to (vi) or steps (ii) to (xiii) to add additional feature or feature and via layers if required, and
- (xv) etching away sacrificial substrate.

31. The method of claim 1 where the dam is fabricated on the upper surface of the interposer by screen printing an epoxy; by depositing a photo-sensitive thick solder mask or by applying and curing an SU-8 layer.

* * * * *